(12) United States Patent
Ohayashi et al.

(10) Patent No.: US 7,247,553 B2
(45) Date of Patent: Jul. 24, 2007

(54) METHOD OF MANUFACTURING A SEMICONDUCTOR DEVICE

(75) Inventors: Masayuki Ohayashi, Ome (JP); Takashi Yokoi, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/431,385

(22) Filed: May 8, 2003

(65) Prior Publication Data

US 2003/0211719 A1    Nov. 13, 2003

(30) Foreign Application Priority Data

May 9, 2002    (JP)    ............................. 2002-134545

(51) Int. Cl.
   *H01L 21/4763*    (2006.01)
(52) U.S. Cl. ..................... 438/622; 438/639; 438/129
(58) Field of Classification Search ................ 438/129, 438/618, 622, 639
   See application file for complete search history.

(56) References Cited

U.S. PATENT DOCUMENTS 5,168,342 A * 12/1992 Shibata ....................... 257/210
5,770,519 A * 6/1998 Klein et al. .................. 438/639
6,515,511 B2 * 2/2003 Sugibayashi et al. ......... 326/41

FOREIGN PATENT DOCUMENTS

| JP | 57-112050 | * | 7/1982 |
| JP | 9-266249 A | | 10/1997 |
| JP | 10-233442 A | | 9/1998 |
| JP | 2000-332106 | | 11/2000 |
| JP | 2001-44196 A | | 2/2001 |
| JP | 2002-76114 | * | 3/2002 |
| JP | 2002-076114 | | 3/2002 |

* cited by examiner

*Primary Examiner*—Thanh Nguyen
(74) *Attorney, Agent, or Firm*—Antonelli, Terry, Stout & Kraus, LLP.

(57) ABSTRACT

To ensure the connectability of wiring lines in a semiconductor device having terminals or reservoirs, plural terminals of a cell, which constitutes the semiconductor device, are each formed in a shape having a length corresponding to two or more lattice points. The terminals are arranged so that one or more lattice points are interposed between adjacent terminals. Among the terminals, as to terminals that are adjacent to each other in their shorter direction, it is allowable for them to partially overlap each other in their shorter direction. In this state, second-layer wiring lines are connected to the terminals via through holes, whereby reservoirs can be generated at the terminals, respectively.

6 Claims, 25 Drawing Sheets

METHOD OF MANUFACTURING A SEMICONDUCTOR DEVICE

BACKGROUND OF THE INVENTION

The present invention relates to a method of manufacturing a semiconductor device, as well as to a semiconductor device fabrication technique; and, more particularly, the invention relates to a technique which is effectively applicable to a method of manufacturing a semiconductor device which requires terminals, as well as the semiconductor device, or a method of manufacturing a semiconductor device which requires a reservoir in a hole for connection between different layers, as well as to the semiconductor device itself.

In a typical semiconductor device, for example, an upper-layer wiring line and a lower-layer wiring line are electrically connected to each other through a hole. First, the reason for the need for a reservoir will be described. For example, according to Japanese Unexamined Patent Publication No. Hei 9(1997)-266249, in a through hole for connection between a certain wiring layer and a wiring layer which overlies or underlies the said wiring layer, there occurs an electro-migration (EM) phenomenon, such that a direct current flows between the through hole and the wiring line, resulting in the flowing out of atoms which constitute the wiring line. In this case, there arises the problem that a void is formed eventually in the wiring line portion from which the atoms have flowed out, leading to a breaking of the wiring line. Or, even if such a breaking of the wiring line does not occur, an increase in the contact resistance between the through hole and the wiring line results, causing malfunction of the semiconductor device.

To avoid such an EM phenomenon, for example, according to the above-referred publication Hei 9(1997)-266249, a surplus portion, i.e., a reservoir, is provided at a wiring end, allowing it to serve as a supply source for replenishing the atoms that flow out, thereby prolonging the EM life of the wiring line. However, there is a concern that the provision of such a reservoir may result in a lowering of the integration density of the wiring. In this regard, for example, in Japanese Unexamined Patent Publication No. Hei 10(1998)-233442, it is described that, by thickening a metal accumulating portion of a wiring layer, it is possible to improve the EM resistance of the wiring layer without making the wiring length large. Further, for example, according to Japanese Unexamined Patent Publication No. 2001-44196, a metallic reservoir is provided near a wiring end and is connected mechanically to a lower or upper side of the wiring.

However, the present inventor has found that the above-described reservoir technique involves the following problem.

In the above-referenced literature, notice is taken of an intermediate portion of wiring, but it is at the beginning and end terminal portions of wiring that a bad influence of the reservoir appears more conspicuously. At each terminal portion it is necessary to ensure that the wiring is connected to a point of the terminal of concern. In this regard, if a reservoir cannot be formed at the wiring portion, the wiring may be completed bypasswise. That is, wiring may be bypassed in order to form a through hole at a position where a reservoir can be formed, whereas, in the case of a terminal, the wiring must be made to an absolute position of the terminal. Thus, the difficulty of wiring attributable to a reservoir at the terminal portion is enhanced. Particularly, an ordinary cell has plural terminals for input and output, and the occurrence of a reservoir at the terminal portion imposes a restriction on the arrangement of terminals near the terminal of concern.

The above-described problem will now be described by way of example with reference to FIGS. 30 to 34, which illustrate principal portions of selected planes in a layout design of wiring layers which constitute a semiconductor device. In FIGS. 30 to 34, there are arranged plural wiring channels Cx extending in the right and left directions and plural wiring channels Cy extending perpendicularly to the wiring channels Cx so as to form a lattice. The wiring channels Cx represent first layer wiring channels, while the wiring channels Cy represent second layer wiring channels, which overlie the first layer wiring channels.

First, FIG. 30 shows an example in which terminals 50a and 50b are arranged side by side on lattice points which are adjacent to each other in the right and left directions, as seen in FIG. 30. The terminals 50a and 50b are each formed as a square pattern including only one lattice point. Reservoirs 51a1~51a4 and 51b1~51b4 having the possibility of arrangement are disposed along the four sides of the terminals 50a and 50b, respectively. Usually, the spacing between wiring channels is set at a spacing which uses, as a basic unit, a distance corresponding to the sum of a minimum wiring width and a minimum wiring spacing, thereby ensuring as many available wiring channels as possible. Therefore, the reservoir 51a4 at the terminal 50a does not satisfy the minimum space to be left between it and the terminal 50b opposed thereto, and, thus, it becomes impossible to properly dispose the reservoir 51a4. It also becomes impossible to properly dispose the reservoir 51b2 at the terminal 50b. That is, as to the terminal 50a, only the reservoirs 51a1 and 51a3 can be provided, while, as to the terminal 50b, only the reservoirs 51b1 and 51b3 can be provided. As a result, it is only when a first wiring (the same layer as the terminals 50a and 50b), which overlies the upper and lower wiring channels Cx (Cxa, Cxb) shown in FIG. 30, is not present at lattice positions K1, K2, K3, and K4 lying on upper and lower sides of the terminals 50a and 50b that an upper-layer wiring can be connected to the terminals 50a and 50b. This is because, if the first wiring is present at the lattice positions K1, K2, K3, and K4, it becomes impossible to arrange the reservoirs 51a1, 51a3, 51b1, and 51b3. Thus, the capability of connection to the terminals 50a and 50b is limited to the case where the first wiring of the same layer as the terminals 50a and 50b is used for connection to both terminals, and the case where the first wiring is not present at the lattice positions K1, K2, K3, and K4.

Referring now to FIG. 31, an example is shown in which terminals 50a and 50b are arranged side by side on lattice points which are adjacent to each other in the vertical direction, as seen in FIG. 31. In this example, a reservoir 51a3 at the terminal 50a does not satisfy a minimum space to be left between it and the terminal 50b opposed thereto, and, therefore, it becomes impossible to provide the reservoir 51a3. It also becomes impossible to provide a reservoir 51b1 at the terminal 50b. That is, as to the terminal 50a in FIG. 31, only reservoirs 51a2 and 51a4 can be provided, while, as to the terminal 50b, only reservoirs 51b2 and 51b4 can be provided. As a result, it is only when a first wiring (the same layer as the terminals 50a and 50b), lying just under the wiring channels Cy (Cya, Cyb), is not present at lattice positions K5, K6, K7, and K8 lying on the left and right sides of the terminals 50a and 50b that an upper-layer wiring can be connected to the terminals 50a and 50b. That is, the capability of connection to the terminals 50a and 50b is limited to the case where the first wiring line is used for connection to the terminals 50a and 50b and the case where the first wiring is not present at the lattice positions K5, K6, K6, and K8. This is because, if the first wiring is present at the lattice positions K5, K6, K7, and K8, it becomes impossible to provide reservoirs 51a2, 51a4, 51b2, and 51b4, and, thus, even one reservoir cannot be disposed at the terminals 50a and 50b. For this reason it is only when the first wiring of the same layer as the terminals 50a and 50b is used for connection to both terminals and when the first wiring is not present at the lattice positions K5, K6, K7, and K8 that it becomes possible to make a connection to the terminals 50a and 50b.

Further, FIG. 32 shows an example in which terminals 50a and 50b are arranged on lattice points which are adjacent to each other obliquely in the same figure. In this example, a reservoir 51b1 at the terminal 50b does not satisfy the minimum space requirement between it and a reservoir 51a4 at the terminal 50a opposed thereto, so that the concurrent occurrence of both reservoirs is impossible. It also becomes impossible for a reservoir 51b2 to be present concurrently with a reservoir 51a3. Thus, reservoirs which can occur at the terminal 50a are determined by a relation thereof to a reservoir which is present at the terminal 50b. When the reservoir 51b1 is present, only reservoirs 51a1 and 51a3 can be provided, while, when the reservoir 51b2 is present, only reservoirs 51a2 and 51a4 can be provided. Also, as to the terminal 50b, reservoirs which can be provided are determined by the relation thereof to a reservoir which is present at the terminal 50a. When the reservoir 51a is present, only reservoirs 51b1 and 51b3 can be provided, while, when the reservoir 51a4 is present, only reservoirs 51b2 and 51b4 can be provided. As a result, it is when there is no first wiring pattern at a lattice position K10 in the presence of the reservoir 51b1 or when there is no first wiring pattern at a lattice position K9 in the presence of the reservoir 51b2 that it is possible to make a connection from an upper-layer wiring to the terminal 50a. Likewise, it is when there is no first wiring pattern at the lattice position K10 in the presence of the reservoir 51a4, or when there is no first wiring pattern at the lattice position K9 in the presence of the reservoir 51a3, that it becomes possible to make a connection from an upper-layer wiring to the terminal 50b. That is, the capability of connection to the terminals 50a and 50b is limited to the case where the first wiring is used for connection and the case where there is no first wiring at the lattice positions K9 and K10. Thus, for connection to a terminal, it is necessary that a pattern of the same layer as the terminal not be present at a lattice position close to the terminal.

Next, with reference to FIG. 33, consideration will be given to the case where the terminal spacing is widened. FIG. 33 is a plan view showing a layout of terminals in a cell which the present inventor has studied. In figure there are plural terminals 50a and reservoirs 51a1~51a4 having the possibility of arrangement for each of the terminals. The terminals 50a are arranged while leaving a spacing corresponding to one channel in each of the vertical and transverse directions. In such an arrangement, there is no longer a possibility that the inconvenience of connection from an upper-layer wiring becomes impossible due to such obstruction to the occurrence of reservoirs, as illustrated in FIGS. 30 to 32. However, there is only one lattice position where each terminal 50a is disposed, so that, when the wiring channel (the wiring channel of the second-layer wiring) located above the terminal 50a of concern is used by another wiring, it is required, for connection to the terminal 50a, that the connection be made once through the first-layer wiring. After all, it becomes necessary that the first-layer wiring not be present at the lattice position adjacent to the relevant terminal.

According to another proposal, a vacant lattice position for reservoir formation and a vacant lattice position for going through the first-layer wiring are provided at a lattice position adjacent to the relevant terminal beforehand as a reservation area. This method will now be described with reference to FIG. 34. A reservation area 52 corresponding to one channel is provided around each terminal 50a in such a manner that adjacent reservation areas do not overlap each other. In such an arrangement, the inconvenience of connection from an upper-layer wiring, due to an obstruction to the occurrence of reservoirs as illustrated in FIGS. 30 to 32, is eliminated, and the connectability can be improved because each reservation area 52 is applicable also as a vacant lattice position for going through the first-layer wiring. However, the adoption of such a construction results in the necessity of an extremely large extra area, so that in a cell having a particularly large number of terminals and fewer transistors, a relatively larger area is required, and, thus, the wasted area increases in size.

SUMMARY OF THE INVENTION

It is an object of the present invention to provide a technique which makes it possible to maintain the connectability of wiring in a semiconductor device having reservoirs.

The above and other objects and novel features of the present invention will become apparent from the following description and the accompanying drawings.

Typical modes of the present invention as disclosed herein will be outlined below.

According to the present invention, a terminal is formed in a shape including two or more lattice points.

Further, according to the present invention, plural terminals are arranged in such a manner that a vacancy corresponding to one or more lattice points is present between longitudinally adjacent terminals.

In one aspect of the present invention, there is provided a semiconductor device comprising:

(a) a plurality of terminals formed in a first wiring layer;

(b) a plurality of wiring lines formed in a second wiring layer that is different from the first wiring layer and is connected to a desired one of the plural terminals through a hole; and (c) a surplus portion provided at a position where the hole is formed in the desired terminal and the plural wiring lines, wherein the plural terminals are each formed so as to include two or more lattice points, and the plural terminals are arranged in such a manner that one or more lattice points are interposed between adjacent terminals.

In another aspect of the present invention, there is provided, in combination with the above aspect, a semiconductor device wherein, as to the terminals adjacent to each other in a shorter direction of the terminals among the plural terminals, such terminals are arranged so as to permit them to be partially adjacent to each other without leaving a space corresponding to one lattice point between the adjacent terminals.

In a further aspect of the present invention, there is provided, in combination with any of the above aspects, a semiconductor device wherein wiring channels which permit the passage of wiring are disposed in the first wiring layer other than wiring channels used for the plural terminals.

In a still further aspect of the present invention, there is provided, in combination with any of the above aspects, a semiconductor device wherein some of the plural terminals are integral and connected with wiring lines in the first wiring layer.

In a still further aspect of the present invention, there is provided, in combination with any of the above aspects, a semiconductor device wherein the surplus portion at the desired terminal is provided so as to extend longitudinally of the desired terminal by a length not larger than a distance that the desired terminal is spaced by one lattice point from a plane center of the hole.

In a still further aspect of the present invention, there is provided, in combination with any of the above aspects, a semiconductor device wherein when another wiring line or terminal is present at a position adjacent longitudinally to the desired terminal in the same layer as the desired terminal, the surplus portion at the desired terminal is provided so as to extend in a shorter direction of the desired terminal by a length not larger than a distance that a part of the desired terminal is spaced by one lattice point from a plane center of the hole.

In a still further aspect of the present invention, there is provided, in combination with any of the above aspects, a semiconductor device wherein the plural terminals and wiring lines are formed by conductor films buried in wiring apertures formed in an insulating film on a semiconductor substrate.

In a still further aspect of the present invention, there is provided, in combination with any of the above aspects, a semiconductor device wherein the plural terminals are terminals for input and output in a cell which constitutes a part of the semiconductor device.

In a still further aspect of the present invention, there is provided a semiconductor device comprising:

(a) a plurality of terminals formed in a first wiring layer;

(b) a plurality of wiring lines formed in a second wiring layer that is different from the first wiring layer and is connected to a desired one of the plural terminals through a hole;

(c) a surplus portion provided at a position where the hole is formed in the desired terminal and the plural wiring lines, wherein the plural terminals are each formed so as to include two or more lattice points, and the surplus portion in the plural wiring lines is provided so as to extend in a direction away from the plural wiring lines by a length not larger than a distance that the plural wiring lines are spaced by one lattice point from a plane center of the hole.

In a still further aspect of the present invention, there is provided, in combination with the aspect just described above, a semiconductor device wherein the plural terminals are arranged in such a manner that one or more lattice points are interposed between adjacent terminals.

In a still further aspect of the present invention, there is provided, in combination with the aspect described just above or just above but one, a semiconductor device wherein, as to the terminals adjacent to each other in a shorter direction of the terminals, they are arranged so as to permit them to be partially adjacent to each other without leaving a space corresponding to one lattice point between the adjacent terminals.

In a still further aspect of the present invention, there is provided a semiconductor device comprising:

(a) a plurality of terminals formed in a first wiring layer;

(b) a plurality of wiring lines formed in a second wiring layer that is different from the first wiring layer and is connected to a desired one of the plural terminals through a hole;

(c) a surplus portion provided at a position where the hole is formed in the desired terminal and the plural wiring lines, wherein the plural terminals are each formed so as to include two or more lattice points.

In a still further aspect of the present invention, there is provided a semiconductor device comprising:

(a) a plurality of input/output terminals of a cell formed in the first wiring layer;

(b) a plurality of first wiring lines formed in the first wiring layer and arranged on a plurality of first wiring channels extending in a first direction; and (c) a plurality of second wiring lines formed in a second wiring layer, which overlies the first wiring layer, the second wiring lines being arranged on a plurality of second wiring channels extending in a second direction orthogonal to the first direction, wherein the plural terminals each extend in the first direction so as to include two or more lattice points which are formed by the first and second wiring channels, the first wiring lines are electrically connected to the terminals, extend in the first direction, and are electrically connected to the terminals of the cells which are arranged spacedly in the first direction, and the second wiring lines are electrically connected to the terminals and extend in the second direction.

In a still further aspect of the present invention, there is provided, in combination with the aspect just described above, a semiconductor device wherein the plural input/output terminals of the cells are arranged within three first wiring channels.

In a still further aspect of the present invention there is provided a semiconductor device comprising:

(a) a plurality of cells arranged in both a first direction and a second direction orthogonal to the first direction;

(b) a plurality of input/output terminals of each of the cells formed in the first wiring layer;

(c) a plurality of first wiring lines formed in the first wiring layer and arranged on a plurality of first wiring channels extending in the first direction; and (d) a plurality of second wiring lines formed in a second wiring layer which overlies the first wiring layer and arranged on a plurality of second wiring channels extending in the second direction, wherein the plural input/output terminals each extend in the first direction so as to include two or more lattice points which are formed by the first and second wiring channels, the first wiring lines include wiring lines connected electrically to the input/output terminals, extending in the first direction and connected electrically to the terminals of the cells which are arranged spacedly in the first direction, and also include over-the-cell passing wiring lines which pass over at least the cells, and the second wiring lines are electrically connected to the input/output terminals and extend in the second direction.

DETAILED DESCRIPTION OF PREFERRED EMBODIMENTS

Figure 1:
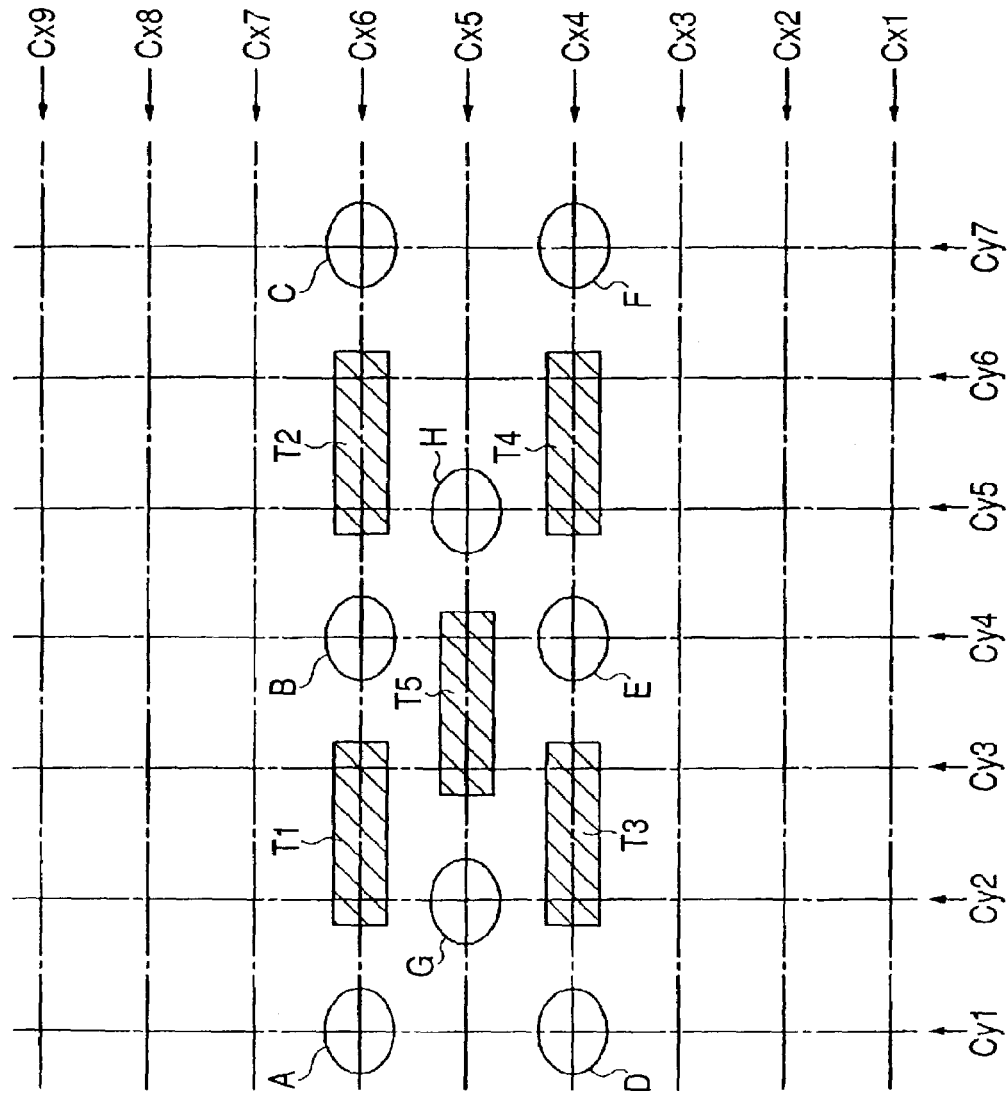
FIG. 1 is a plan view showing a common structural portion of a cell in a semiconductor device according to an embodiment of the present invention.

Before describing embodiments of the present invention in detail, an explanation will be given below of the meanings of terms used in the description of the embodiments.

1. The term "semiconductor device" or "semiconductor integrated circuit device" is meant to include not only a device formed on a semiconductor or an insulating substrate, such as silicon wafer or sapphire substrate, but also, unless otherwise specified, one formed on another insulating substrate, such as glass, e.g., TFT (Thin-Film-Transistor) and STN (Super-Twisted-Nematic) liquid crystals.

2. By the term "Macro Cell" is meant a circuit block or a functional block of higher function and larger scale than a basic cell. Macro Cell is classified into a hard macro with an established mask pattern and a soft macro wherein a mask pattern is generated at every design with library information up to netlist expression. As macro cells there are a standard cell (polycell) which represents a logic gate of a small scale and whose height is constant, module cells having a regular layout structure and generated automatically in accordance with input parameters by a module generator, such as a RAM (Random Access Memory), ROM (Read Only Memory), PLA (Programmable Logic Array), multiplier, adder, and data path, as well as a CPU (Central Processing Unit), analog cell, and I/O (Input/Output) cell. In a Macro Cell, in addition to mask pattern information, such information as cell frame and terminal information for automatic layout wiring, a simulation-oriented functional model, a logic model and a delay parameter, are registered as a cell library in a design system (e.g., computer) and can be read easily from the cell library for use in simulation, for example.

3. By the term "intra-cell wiring line" is meant a wiring line for a signal and for power supply, which is used mainly for constituting a desired circuit (function) within a cell.

4. By the term "wiring lattice" is meant a line indicating a wiring layout path (wiring channel) and which comprises plural wiring lattice lines orthogonal to each other. A point of intersection of such perpendicularly intersecting wiring lattice lines is designated a lattice point. There are two types, in one of which a boundary of the wiring lattice and that of the macro cell coincide with each other, and in the other both boundaries are not coincident. In the former, the ease of wiring can be improved because a wiring line can be disposed at the boundary of the macro cell. In the latter, the size of a semiconductor chip can be reduced because it is possible to reduce the cell size.

5. In the following embodiments, for example, when it is indicated that the object of concern is formed of copper, the use of copper as a main component is contemplated. In more particular terms, even copper of a high purity inevitably contains impurities, and, therefore, the inclusion of additives and impurities in a member formed of copper is not excluded. This concept is not limited to copper, but is also true of other metals (e.g., titanium nitride and aluminum).

6. By the term "chemical mechanical polishing (CMP)" refers to the polishing of a surface to be polished while relatively moving the surface in a planar direction under the supply of a slurry in a state in which the surface to be polished is kept in contact with a polishing pad of a relatively soft cloth-like sheet material. In the following disclosure, the term in question is meant to also include chemical mechanical lapping (CML), wherein a surface to be polished is polished by a relative movement thereof on a hard grindstone surface, as well as a polishing method which uses fixed grain, and a grain-free CMP not using abrasive grain.

7. By the term "conductive barrier film" is meant an electrically conductive film having a diffusion barrier property which is formed to be relatively thin on a side face or a bottom of buried wiring to prevent the diffusion of copper into an interlayer insulating film or to a lower layer. Generally, there is used a refractory metal or a nitride thereof, such as titanium nitride (TiN), tantalum (Ta), or tantalum nitride.

8. By the term "buried wiring" or "buried metal wiring" is meant wiring formed by burying a conductive film in the interior of a wiring aperture, such as slot or hole formed in an insulating film, and by subsequent patterning with use of a wiring forming technique, which involves removal of an unnecessary conductive film on the insulating film, such as a single damascene or a dual damascene process. Generally, by the term "single damascene" is meant a buried wiring process involving a two-stage burying of metal for plug and metal for wiring. By the term "dual damascene" is generally meant a buried wiring process in which both metal for plug and metal for wiring are buried at the same time. In many cases, copper buried wiring lines are used in a multi-layer construction.

9. The term "silicon nitride" or "silicon nitride film" is meant to include not only $Si_3N_4$ but also an insulating film of a silicon nitride having a similar composition.

10. By the term "insulating film of a low dielectric constant (low-K insulating film)" is meant, as an example, an insulating film having a dielectric constant lower than that of a silicon oxide film (e.g., TEOS (tetraethoxysilane) oxide film) included in a passivation film. Generally, a TEOS oxide film having a relative dielectric constant $\epsilon$ of about 4.1 to 4.2 or less is called an insulating film of a low dielectric constant.

11. By the term "input/output terminal" is meant one or both of a terminal for input and a terminal for output in a desired circuit.

Where required for convenience' sake, the following embodiments will be described in a divided manner into plural sections or embodiments, but unless otherwise mentioned, they are not unrelated to each other, but are in a relation such that one is a modification, a detailed description, or a supplementary explanation, of part or the whole of the other. In the following embodiments, when reference is made to a number of elements (including the number, numerical value, quantity, and range), no limitation is made to the number referred to, but numerals above and below the number referred to will do as well unless otherwise mentioned and except in the case where it is basically evident that a limitation is made to the number referred to. Further, it goes without saying that in the following embodiments the constituent elements (including constituent steps) are not always essential unless otherwise mentioned and except in the case where they are basically considered essential obviously. Likewise, it is to be understood that when reference is made to the shapes, positions and relation of components in the following embodiments, those substantially closely similar to or resembling such shapes, etc. are also included, unless otherwise mentioned and except in the case where a negative answer basically results obviously. This is also true of the foregoing numerical value and range. Moreover, in all of the drawings for illustrating the embodiments, portions having the same functions are identified by like reference numerals and repeated explanations thereof will be omitted. In the drawings related to the following embodiments, even a plan view may be hatched to make it easier to see. Further, in the following embodiments, MIS-FET (Metal Insulator Semiconductor Field Effect Transistor), which is a typical field effect transistor, is abbreviated to MIS, a p-channel MIS-FET is abbreviated to pMIS, and an n-channel MIS-FET is abbreviated to nMIS. It is assumed that MOS-FET (Metal Oxide Semiconductor Field Effect Transistor) is included in a more specific concept of MIS.

Embodiments of the present invention will be described in detail hereinunder with reference to the accompanying drawings.

First Embodiment

FIG. 1 is a plan view of a principal portion, showing a common structural portion of a cell in design data of a semiconductor device having reservoirs according an embodiment of the present invention.

The reference symbols Cx1 to Cx9 and Cy1 to Cy7 denote wiring channels (wiring lattice lines) extending in the shape of a wiring lattice. The plural wiring channels Cx1 to Cx9, which extend in parallel with one another in the right and left direction (a first direction) in FIG. 1 represent positions of channels which are employable by automatic wiring in a first wiring layer of the semiconductor device, for example. First-layer wiring lines in the semiconductor device are arranged preferentially along the wiring channels Cx1~Cx9. Plural wiring channels Cy1 to Cy7 extend in parallel with one another in the vertical direction (a second direction orthogonal to the first direction) so as to perpendicularly intersect the wiring channels Cx1~Cx9. The wiring channels Cy1~Cy7 represent positions of channels which are employable by automatic wiring in a second wiring layer of the semiconductor device, for example. Thus, second-layer wiring lines in the semiconductor device overlie the first wiring layer and are arranged preferentially along the wiring channels Cy1~Cy7. The spacing between adjacent wiring channels is set to a spacing which uses, as a basic unit, a distance corresponding to the sum of a minimum wiring width and a minimum wiring spacing, whereby it is intended to ensure as many available wiring channels as possible.

The reference numerals T1 to T5 represent terminals (input/output terminals) of a predetermined cell which requires the arrangement of reservoirs. The five terminals T1~T5 illustrated in the figure are constituted by the same layer as the first wiring layer and are of the same shape and size. As will be described later, the input/output terminals T1~T5 of the cell are electrically connected to a gate electrode or a drain region of a MIS which constitutes the cell. Though not shown, plural cells are arranged in both vertical and transverse directions in the figure and input/output terminals of those cells are electrically connected with each other through the first-layer wiring lines extending in the transverse direction mainly on the wiring channels Cx1~Cx9 and the second-layer wiring lines extending in the vertical direction on the wiring channels Cy1~Cy7, whereby a desired logic circuit is implemented.

The terminals T1~T5 are usually positioned on lattice points which are formed by the wiring channels Cx1~Cx9 and Cy1~Cy7. Each of the terminals T1~T5, for example, has a shape which includes two lattice points adjacent to each other in the extending direction of the wiring channels Cx1~Cx9 (in the direction in which the first-layer wiring lines are laid preferentially, i.e., in the transverse, or right and left, direction in FIG. 1). Each terminal has a pattern of rectangular shape, as seen in plan view, in which its length in the direction of the wiring channels Cx1~Cx9 at the terminals T1~T5 is larger than that in the direction of the wiring channels Cy1~Cy7. Consequently, at the time of connecting the terminals T1~T5 with the second-layer wiring lines extending in the vertical direction on the wiring channels Cy1~Cy7, it is possible to ensure two wiring channels Cy for each terminal, and, hence, it is possible to improve the freedom of connection between the terminals T1~T5 and the second-layer wiring lines. Moreover, by constituting each of the terminals T1~T5 as a pattern of rectangular shape, as seen in plan view, which includes two lattice points Cy in the transverse direction, and by extending the first-layer wiring lines in the transverse direction on the wiring channels Cx1~Cx9, it is possible to improve the freedom of arranging the first-layer wiring lines on the wiring channels Cx and improve the density of wiring lines for connection between cells, which are arranged spacedly in both vertical and transverse directions. In the illustrated example, the terminals T1~T5 are arranged on three wiring channels Cx4~Cx6, and three wiring channels Cx1~Cx3 and Cx7~Cx9 are narrowly arranged respectively above and below the wiring channels Cx4~Cx6. Thus, the area where the terminals T1~T5 are arranged is limited. Accordingly, for example, an over-the-cell passing wiring line which passes over a cell of concern, and a wiring line which is electrically connected to any of the terminals T1~T5 of the cell and which passes a cell adjacent transversely to the cell of concern, can be arranged, whereby it is possible to improve the density of wirings for connection between cells spaced in both vertical and transverse directions, and, hence, it is possible to attain a high integration.

The reference characters A to H denote vacant lattice positions adjacent to the terminals T1~T5. The reference characters A to F represent vacant lattice positions adjacent in the length direction of the terminals T1~T5, i.e., in the extending direction of the wiring channels Cx1~Cx9, while G and H represent vacant lattice positions adjacent in the width, or shorter, direction of the terminals T1~T5, i.e., in the extending direction of the wiring channels Cy1~Cy7. The vacant lattice positions A~H are employable also as wiring channels for the first-layer wiring lines and are provided as surplus regions for the formation of reservoirs to be described later.

In this first embodiment, when arranging the terminals T1 to T5 of a predetermined cell in a wiring layout design for the semiconductor device, for example, the following rules are established with respect to their shape and arrangement.

According to the first rule, the terminals T1~T5 should each basically include two or more lattice points. Although the inclusion of two lattice points at each of the terminals T1~T5 is shown in FIG. 1, no limitation is made thereto. Each terminal may include three or four lattice points, e.g., two or more lattice points. Although the terminals T1~T5 shown in FIG. 1 are of the same shape and size, no limitation is made thereto. In plural terminals of one cell there may be included terminals of different shapes and sizes. This first rule does not exclude the case where a terminal including only one lattice point is included among plural terminals in the same wiring layer. For example, there can be the case where, in a predetermined wiring layer, there are included not only the terminals T1~T5 of the predetermined cell, but also a terminal of that cell or any other cell whose terminal is square, as seen in plan view, and which includes only one lattice point.

The second rule is that one or more lattice points should basically be present between adjacent ones of the terminals T1~T5. In FIG. 1, each vacant lattice position is set to one lattice position, whereby a reduction in size can be effected. However, as an exception to the second rule, there is the following third rule. According to the third rule, as to terminals adjacent to each other only in part (overlapping), not the whole, thereof out of terminals adjacent to one another in the shorter direction of the terminals, a vacant lattice position corresponding to one lattice point need not be interposed between the adjacent (overlapping) portions of the partially adjacent terminals. In FIG. 1, the relation between the terminals T1 and T5 and that between the terminals T3 and T5 correspond to this third rule. This is because in this case the presence of a vacant lattice position G permits ensuring of a wiring channel and also because the absence of a vacant lattice position between the adjacent terminals T1 and T5 and between the adjacent terminals T3 and T5 permits a reduction in size.

Figure 2:
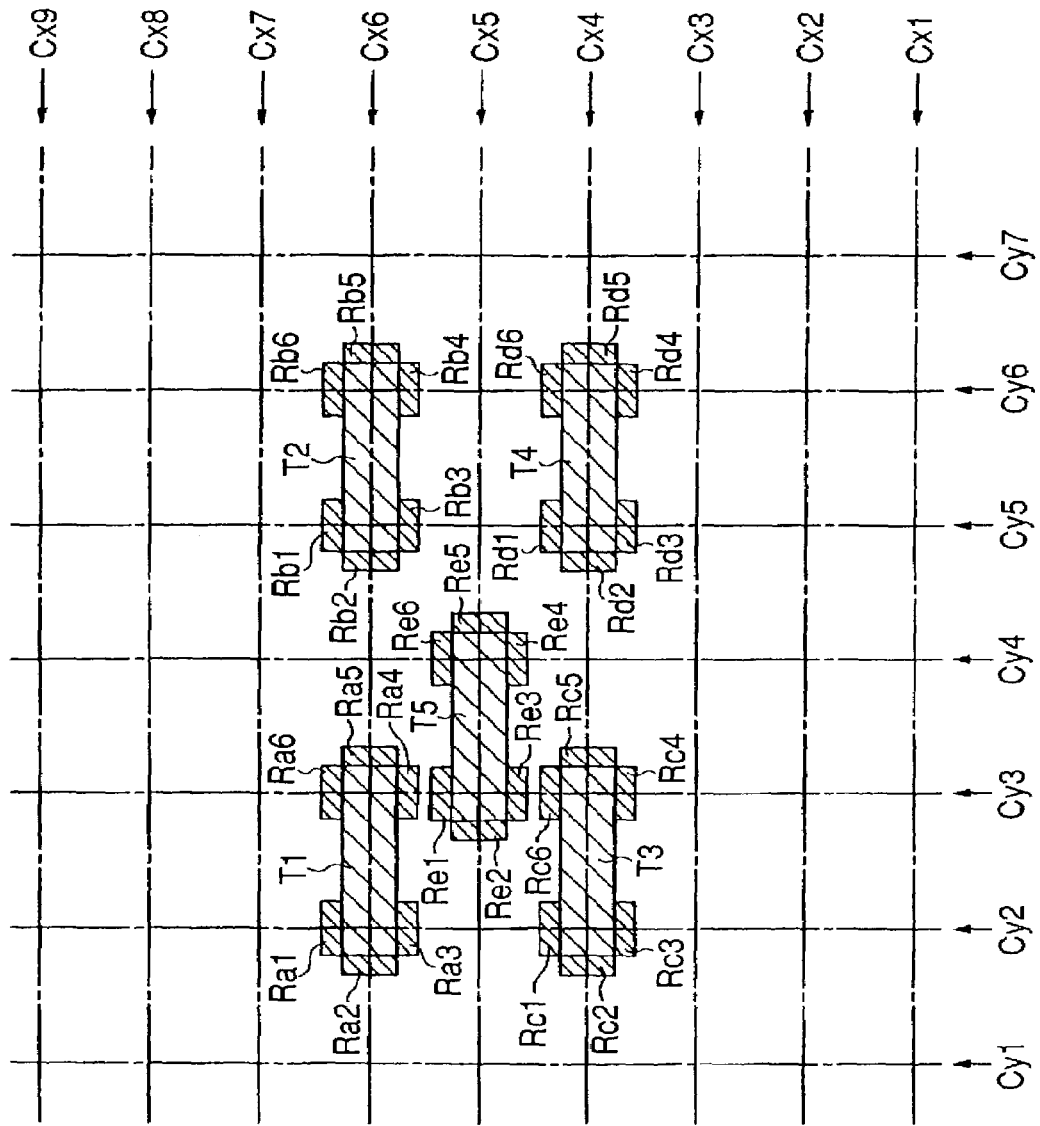
FIG. 2 is a plan view of the semiconductor device with reservoir patterns arranged in the structural portion shown in FIG. 1.

Referring now to FIG. 2, there is illustrated a case where patterns of reservoirs (surplus portions) Ra1~Ra6, Rb1~Rb6, Rc1~Rc6, Rd1~Rd6, and Re1~Re6 are arranged in FIG. 1. FIG. 2 shows all of the reservoirs having the possibility of arrangement, Ra1~Ra6, Rb1~Rb6, Rc1~Rc6, Rd1~Rd6, and Re1~Re6. The layout of these reservoirs changes according to the layout of upper-layer wiring lines connected to the terminals T1~T5. As will be described later, if an arbitrary reservoir is disposed at an arbitrary terminal, there may occur a case where a predetermined reservoir at a terminal adjacent to the arbitrary terminal cannot be generated (disposed). The reservoirs Ra1~Ra6, Rb1~Rb6, Rc1~Rc6, Rd1~Rd6, and Re1~Re6 have each a length not larger than a distance spaced by one lattice point from a plane center of a hole (e.g., a through hole to be described later) which is connected to each of the terminals T1~T5.

A study will first be made of the terminals T1 and T2, which are arranged side by side in a mutually adjacent relation to each other on the wiring channel Cx6. Since a vacant lattice position is present between the terminals T1 and T2, even if the reservoir Ra5 at terminal T1 is already present, the reservoir Rb2 at terminal T2 can be generated at a position opposed to the reservoir Ra5. Likewise, even if the reservoir Rb2 is already present, the reservoir Ra5 can be generated. That is, as to the terminals T1 and T2, irrespective of whether the reservoirs Ra5 and Rb5 are present or not, it is possible to make a connection from second-layer wiring lines to the terminals T1 and T2 via through holes.

Further, since the terminal T1 is formed so as to occupy two lattice points, even if an over-the-cell passing wiring line formed by a second-layer wiring line uses the wiring channel Cy2, the terminal T1 is present below the wiring channel Cy3, so the use of the wiring channel Cy3 permits connection from the second-layer wiring line to the terminal T1 via a through hole. Likewise, since the terminal T2 is also formed so as to occupy two lattice points, even if an over-the-cell passing wiring line formed by a second-layer wiring line uses the wiring channel Cy5, the terminal T2 is present below the wiring channel Cy6, so the use of the wiring channel Cy6 permits connection from the second-layer wiring line to the terminal T2 via a through hole.

Next, a study will be made of the terminals T2 and T4, which are arranged side by side in the extending direction of the wiring channels Cy1~Cy7. As noted above, since one vacant lattice position is present between the terminals T2 and T4, even if the reservoir Rb3 or Rb4 at the terminal T2 is already present, the reservoir Rd1 or Rd6 at the terminal T4 may be generated at a position opposed to the reservoir Rb3 or Rb4. Likewise, even if the reservoir Rd1 or Rd6 is already present, the reservoir Rb3 or Rb4 can be generated. That is, as to the terminals T2 and T4, irrespective of whether the reservoirs Rb3, Rb4, Rd1, and Rd6 are present or not, it is possible to make a connection from second-layer wiring lines to the terminals T2 and T4 via through holes. Further, since the terminal T4 is also formed so as to occupy two lattice points, even if an over-the-cell passing wiring line formed by a second-layer wiring line uses the wiring channel Cy5, the terminal T4 is present below the wiring channel Cy6, and, therefore, the use of the wiring channel Cy6 permits connection from the second-layer wiring line to the terminal T4 via a through hole.

Now, a study will be made of the terminals T4 and T5, which are adjacent obliquely to each other. In this case, when the reservoir Re4 at the terminal T5 is present, the reservoir Rd2 at the terminal T4 cannot be generated. Likewise, when the reservoir Re5 at the terminal T4 is present, the reservoir Rd1 at the terminal T4 cannot be generated. However, as noted earlier, since the terminals T4 and T5 each occupy two lattice positions, even if a reservoir at the terminal of concern cannot be generated due to an existing reservoir at a terminal opposed thereto, it becomes possible to make a terminal-second layer wiring line connection via a through hole at another lattice position on the same terminal. For example, although the reservoir Re4 at the terminal T5 is present, whereby the reservoir Rd2 at the terminal T4 cannot be generated, the terminal T4 and a second-layer wiring line can be connected with each other by forming a through hole for the second-layer wiring line in the lattice point of wiring channels Cx4 and Cy6 at the terminal T4.

Next, a study will be made of the terminals T3 and T5, which are adjacent obliquely to each other and each have an overlapping portion corresponding to one channel. In this case, when the reservoir Re3 at the terminal T5 is present, the reservoir Rc6 at the terminal T3 cannot be generated, and when the reservoir Re2 at the terminal T5 is present, the reservoir Rc1 at the terminal T3 cannot be generated. Further, when the reservoir Re4 at the terminal T5 is present, the reservoir Rc5 at the terminal T3 cannot be generated. This relation of reservoir generation can also be said of the reservoir generation at the terminal T5. That is, terminals adjacent to each other in their shorter direction, like terminals T3 and T5, can be adjacent to each other even without leaving a distance corresponding to one lattice point. Moreover, in case of providing a reservoir in the shorter direction of the terminals, the reservoir may be provided at one of the terminals. Further, since the terminals T3 and T5 each occupy two lattice positions, even if a reservoir at the terminal of concern cannot be generated due to an existing reservoir at a terminal opposed thereto, it becomes possible to make a terminal-second layer wiring line connection via a through hole at another lattice position on the same terminal. For example, when the reservoir Re3 at the terminal T5 is present, the reservoir Rc6 at the terminal T3 cannot be generated, but the terminal T3 and the second-layer wiring line can be connected with each other by forming a through hole for the second-layer wiring line in the lattice point of the wiring channels Cx4 and Cy2 at the terminal T3.

Further, since the terminals T3 and T5 are formed so as to occupy two lattice points, even if an over-the-cell passing wiring line formed by a second-layer wiring line uses the wiring channel Cy3, it becomes possible to make a connection from the second-layer wiring line to the terminal T3 via a through hole by using the wiring channel Cy2, because the terminal T3 is present below the wiring channel Cy2. Likewise, since the terminal T5 is present below the wiring channel Cy4, it is possible to make a connection from a second-layer wiring line to the terminal T5 via a through hole by using the wiring channel Cy4. Moreover, since the terminal T3 is formed so as to occupy two lattice points, even if an over-the-cell passing wiring line formed by a second-layer wiring line uses the wiring channel Cy2, it is possible to make a connection from the second-layer wiring line to the terminal T3 via a through hole by using the wiring channel Cy3, because the terminal T3 is present below the wiring channel Cy3.

That is, by setting the terminal-to-terminal distance to a distance which permits one or more lattice points to be disposed therebetween, it becomes possible to form a reservoir at each terminal. Moreover, by constructing the terminals T1~T5 so that each will occupy two lattice points, even if an over-the-cell passing wiring line is present above one lattice point, it is possible to make a connection with a second-layer wiring line by forming a through hole in the other lattice point. Further, even if a reservoir at one lattice point of the terminal of concern cannot be generated due to an existing reservoir at a terminal opposed thereto, like the relation between reservoirs Re4 and Rd2 or the relation between reservoirs Re5 and Rd1 at the terminals T5 and T4, it is possible to form a reservoir at the other lattice point.

Figure 3:
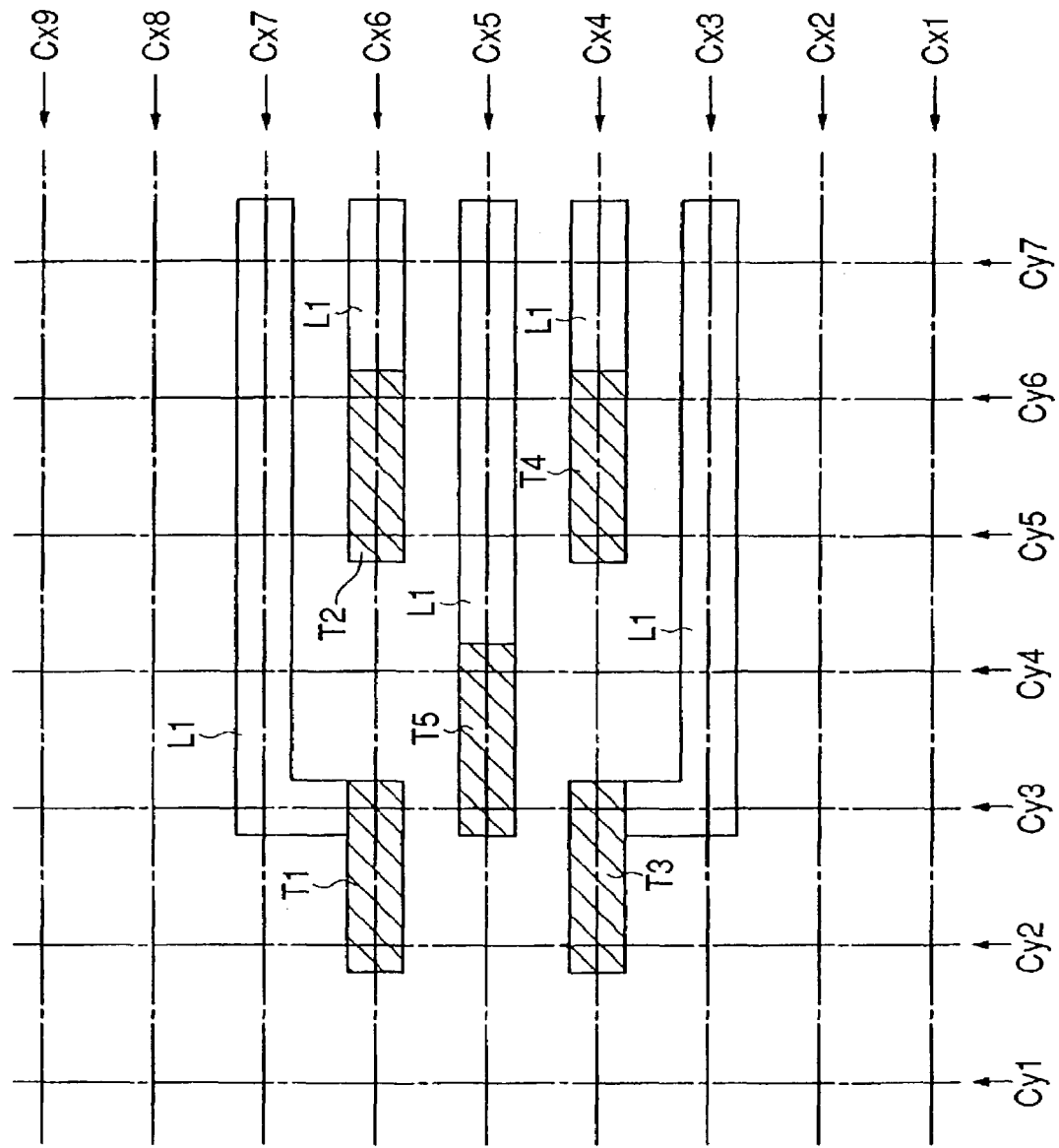
FIG. 3 is a plan view showing a wiring layout in design data with terminals wired using only first-layer wiring lines in the semiconductor device of the embodiment.

FIG. 3 is a plan view showing a wiring layout in design data, in which only first-layer wiring lines are used for wiring the terminals T1~T5. First-layer wiring lines L1 are connected to the terminals T1~T5, respectively. The first-layer wiring lines L1 extend in the transverse direction, i.e., in the right and left direction, mainly on the wiring channels Cx, and they constitute cell-to-cell wiring lines for connection between the terminals of cells which are arranged spacedly in both vertical and transverse directions. It is seen that, by adopting such a construction as provided in this first embodiment, it is possible, with the first-layer wiring lines L1 alone, to make a connection to the terminals T1~T5. In the illustrated structure, through holes for the connection of second-layer wiring lines to the terminals T1~T5 are not formed, nor are shown reservoirs, because it is not necessary to provide reservoirs at the terminals T1~T5. In FIG. 3, in order to make the same figure easier to see, only the terminals T1~T5 are hatched and the first-layer wiring lines L1 are not hatched. In the actual semiconductor device, however, the terminals T1~T5 and the first-layer wiring lines L1 connected thereto are patterned integrally. That is, if through holes are not formed in the terminals T1~T5, neither are reservoirs formed at those terminals. Further, the terminals T1~T5 are connected directly to the first-layer wiring lines L1 and are formed as part of the first-layer wiring lines. Thus, by constructing each of the terminals T1~T5 with use of a pattern of a rectangular shape, as seen in plan view, which includes two lattice points Cy, and by extending first-layer wiring lines in the transverse direction on the wiring channels Cx1~Cx9, it is possible to improve the freedom of arranging first-layer wiring lines on the wiring channels Cx and also to improve the wiring density of wiring lines for connection between cells arranged spacedly in both vertical and transverse directions, thus permitting a high integration. Further, cell-to-cell wiring lines passing the cell of concern and connecting the terminals of cells arranged spacedly in both vertical and transverse directions can be disposed on the vacant wiring channels Cx1, Cx2, Cx8, and Cx9, and thus, it is possible to improve the wiring density of the cell-to-cell wiring lines, permitting the attainment of a high integration.

Figure 4:
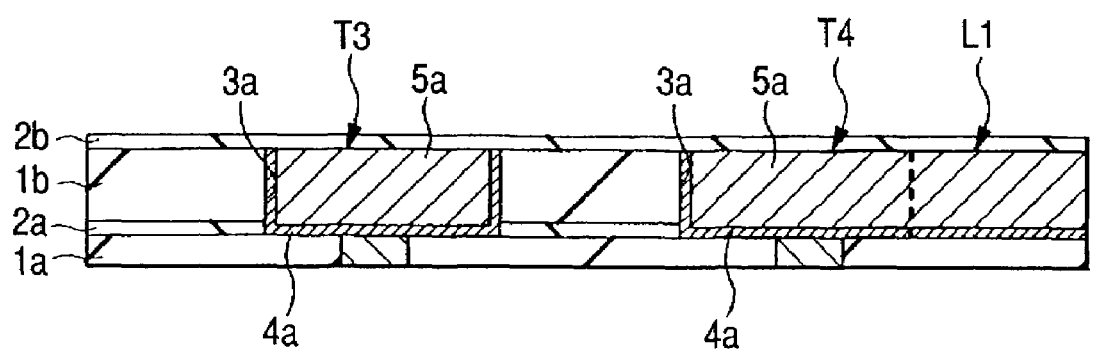
FIG. 4 is a sectional view taken along a wiring channel Cx4 in FIG. 3, showing an example of a wiring structure in a semiconductor device manufactured on the basis of the design data of FIG. 3.
Figure 5:
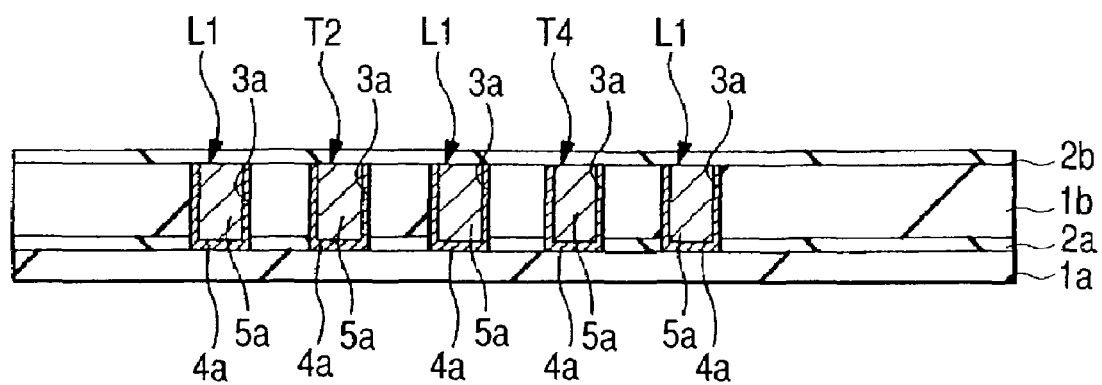
FIG. 5 is a sectional view taken along a wiring channel Cy5 in FIG. 3, showing an example of a wiring structure in the semiconductor device manufactured on the basis of the design data of FIG. 3.

FIG. 4 is a sectional view taken along the wiring channel Cx4 in FIG. 3, showing an example of a wiring structure in a semiconductor device manufactured on the basis of the design data of FIG. 3. FIG. 5 is a sectional view taken along the wiring channel Cy5 in FIG. 3, showing an example of a wiring structure in the semiconductor device manufactured on the basis of the design data of FIG. 3. These figures show an example in which the terminals T1~T5 and the first-layer wiring lines L1 are formed by buried wiring lines in accordance with a single damascene method. The reference numerals 1a, 1b, 2a, and 2b each denote an insulating film. For example, the insulating films 1a and 1b are formed of silicon oxide (e.g., $SiO_2$). The insulating films 1a and 1b may each be formed as a laminate structure comprising a material of a low dielectric constant (so-called Low-K material), such as an organic polymer or organic silica glass, and a silicon oxide film for a Low-K insulating cap formed thereon. Examples of the organic polymer are SiLK (a product of The Dow Chemical Co., U.S.A., a relative dielectric constant 2.7, heat-resisting temperature 490° C. or higher, dielectric breakdown voltage 4.0~5.0 MV/Vm) and FLARE (a product of Honeywell Electronic Materials, U.S.A., a relative dielectric constant 2.8, heat-resisting temperature 400° C. or higher) of a polyallyl ether (PAE)-based material. Examples of the organic silica glass (SiOC-based material) are HSG-R7 (a product of Hitachi Chemical Co., Ltd., a relative dielectric constant 2.8, heat-resisting temperature 650° C.), Black Diamond (a product of Applied Materials, Inc., a relative dielectric constant 3.0~2.4, heat-resisting temperature 450° C.), and p-MTES (a product of Hitachi Kaihatsu, a relative dielectric constant 3.2). Further, as a material of a low dielectric constant for the insulating films 1a and 1b, there may be used, for example, FSG (SiOF-based material), HSQ (hydrogen silsesquioxane)-based material, MSQ (methyl silsesquioxane)-based material, a porous HSQ-based material, a porous MSQ-based material, or a porous organic material. On the other hand, the insulating films 2a and 2b are formed of a silicon nitride, for example. As the material of the insulating films 2a and 2b, there may be used a material of a lower dielectric constant than silicon nitride, such as silicon carbide (SiC), silicon carbonitride (SiCN), or silicon oxynitride (SiON).

Wiring grooves (wiring apertures) 3a are formed in the insulating films 1b and 2a. The terminals T1~T5 and first-layer wiring lines L1 are buried within the wiring grooves 3a and are each provided with a conductive barrier film 4a and a main conductor film 5a. The conductive barrier film 4a is constituted by a conductor film such as, for example, a film of titanium nitride (TiN) having a thickness of about 50 nm, and it is formed so as to embrace an outer periphery (side faces and bottom), except for an upper surface, of the main conductor film 5a. For example, the conductive barrier film 4a has a function of preventing the diffusion of copper (Cu) which is used for forming the main conductor film, a function of improving a close contact between the main conductor film 5a and the insulating films 1a, 1b, 2a, 2b, and a function of improving the wettability of copper at the time of reflow of the main conductor film 5a. As the material of the conductive barrier film 4a, it is preferable to use a refractory metal nitride, which scarcely reacts with copper, such as tungsten nitride (WN) or tantalum nitride (TaN), instead of titanium nitride as referred to above. Further, the titanium substrate may be replaced by a material comprising a refractory metal nitride and silicon (Si) added thereto, or a refractory metal that is difficult to react with copper, such as tantalum (Ta), titanium (Ti), tungsten (W), or titanium tungsten (TiW). The main conductor film 5a is, for example, a film of copper having a thickness of about 800 to 1600 nm. Such a buried wiring structure is obtained by forming the wiring groves 3a, then depositing the conductive barrier films 4a and the main conductor films 5a so as to fill up the wiring grooves 3a, and polishing extra portions of the conductive barrier films 4a and the main conductor films 5a by the CMP method. Thus, the terminals T1~T5 and the first-layer wiring lines L1 are formed integrally. Although in FIG. 4 a boundary between the terminal T4 and the associated first-layer wiring line L1 is indicated with a broken line, there is not a boundary actually.

Figure 6:
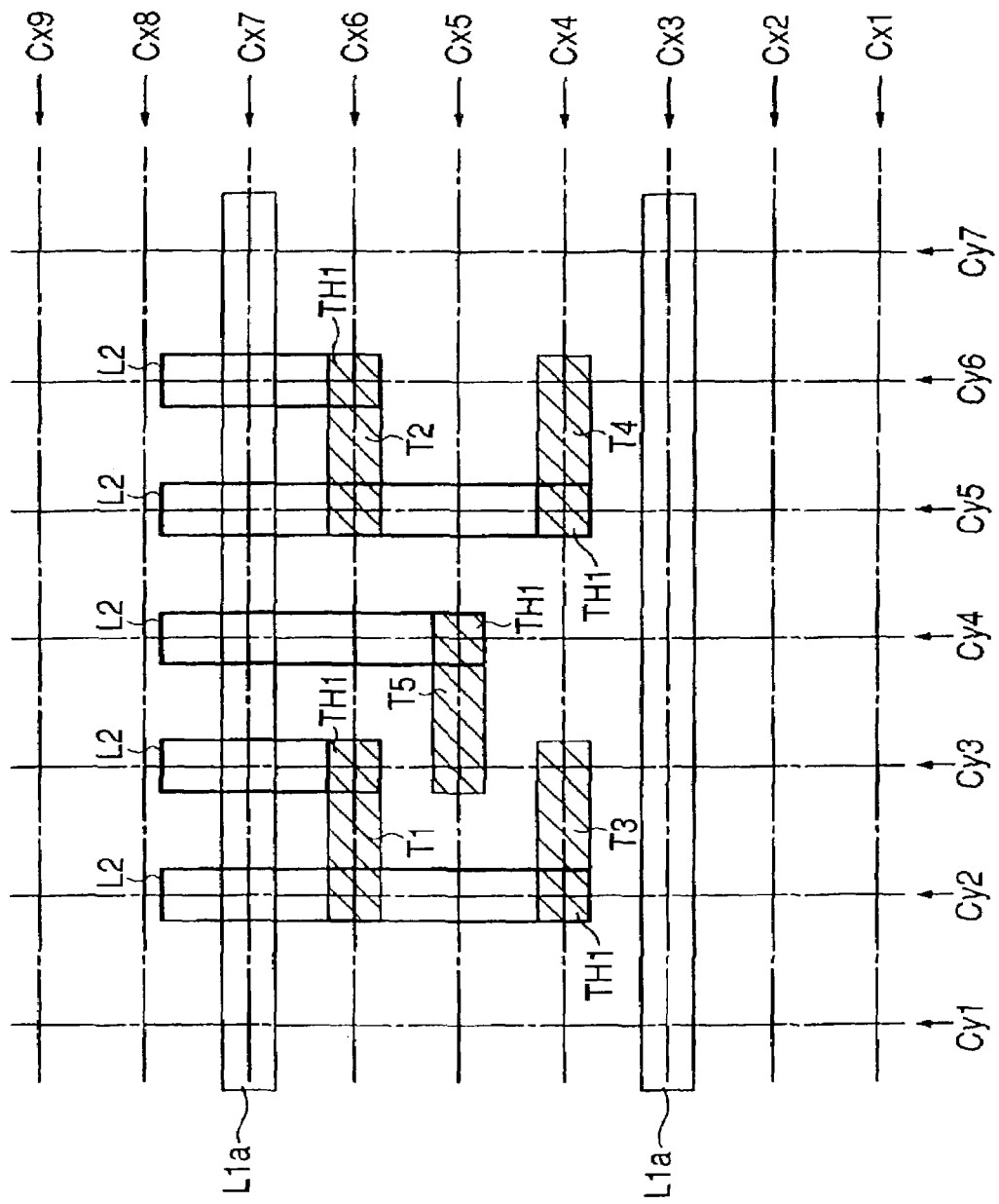
FIG. 6 is a plan view showing a wiring layout in design data with terminals wired using only second-layer wiring lines in the semiconductor device of the embodiment.
Figure 7:
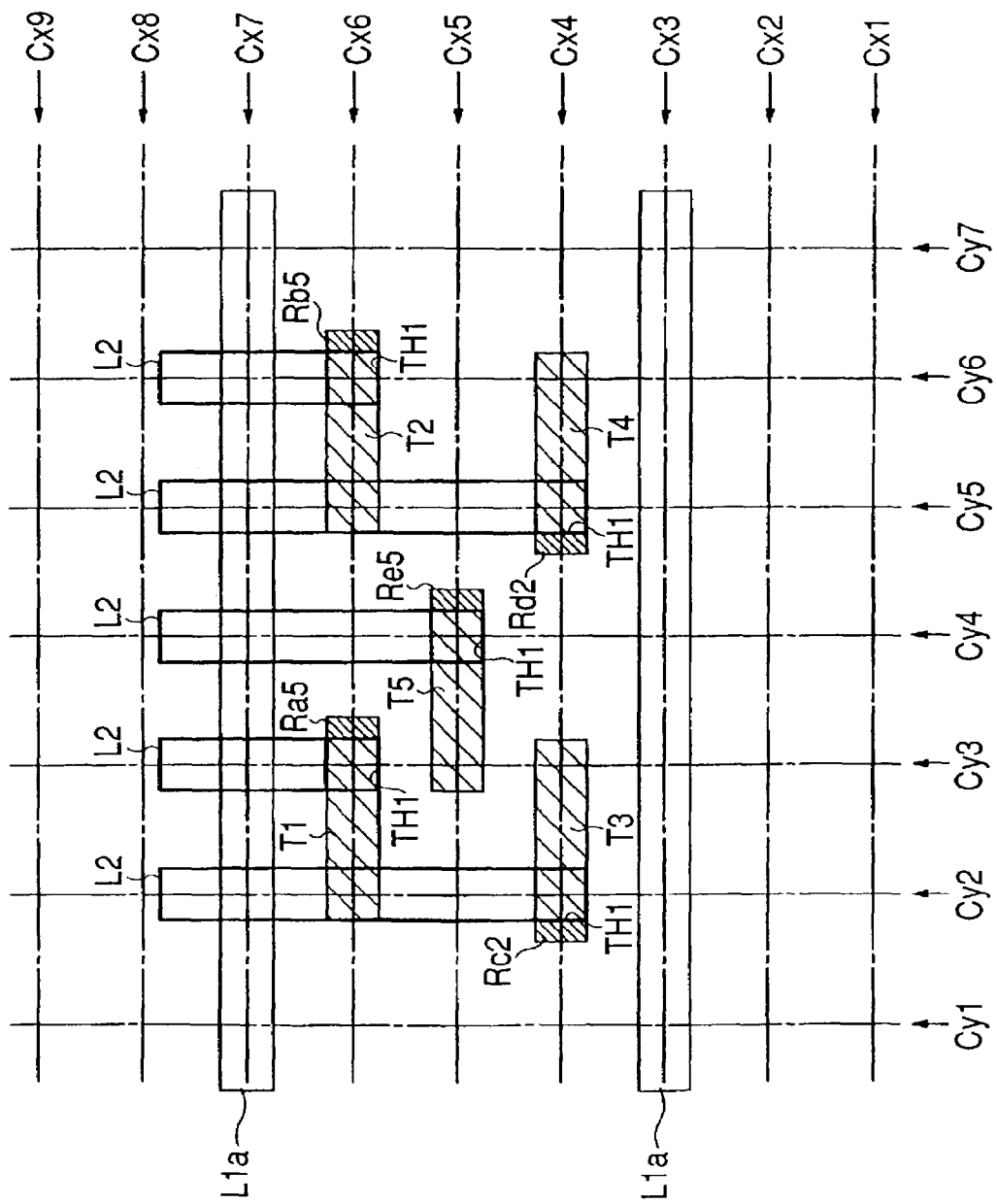
FIG. 7 is a plan view showing an example of the layout of reservoirs at the terminals in FIG. 6.
Figure 8:
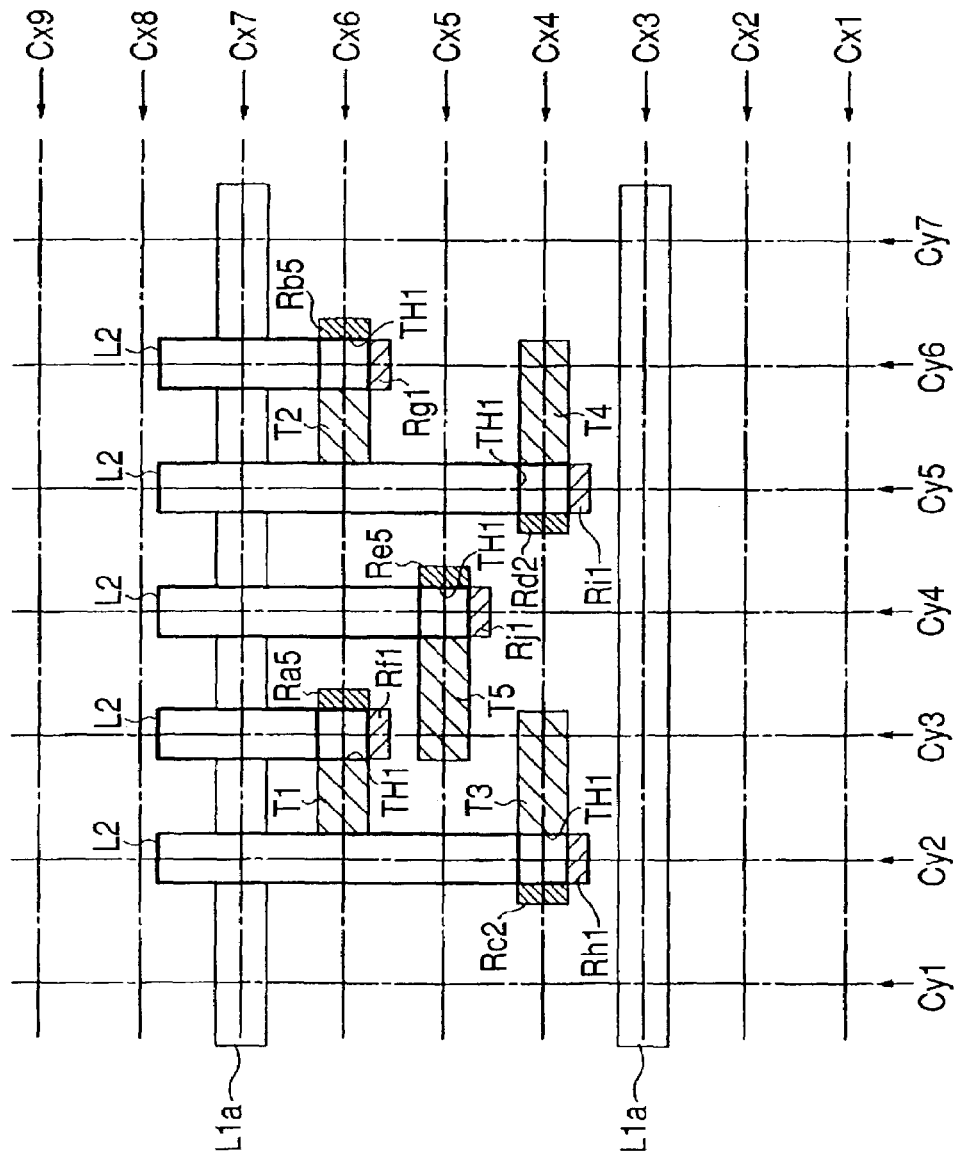
FIG. 8 is a plan view showing an example of the layout of reservoirs in the second-layer wiring lines in FIG. 6.

FIG. 6 is a plan view of a principal portion, showing a wiring layout in design data with terminals T1~T5 wired, using only second-layer wiring lines L2. The second-layer wiring lines L2 are connected to the terminals T1~T5, respectively. The second-layer wiring lines L2 extend in the vertical direction mainly on the wiring channels Cy and constitute cell-to-cell wiring lines for connection between the terminals of cells that are arranged spacedly in both vertical and transverse directions. In the illustrated example, first-layer wiring lines L1a, which serve as over-the-cell passing wiring lines, extend along two wiring channels Cx3 and Cx7, respectively, which sandwich the terminals T1~T5 therebetween. The second-layer wiring lines L2 respectively extend along the wiring channels Cy2~Cy6 and are electrically connected to the terminals T1~T5 via through holes (holes) TH1. FIG. 7 shows an example of the layout of reservoirs at the terminals T1~T5 in FIG. 6. Reservoirs are basically arranged on the lattice point side where the through holes TH1 are arranged, and they are preferentially arranged in the length direction of the terminals T1~T5. Further, the reservoir arrangement is effected in accordance with the foregoing reservoir arrangement rules. In this first embodiment, reservoirs Ra5, Rb5, Rc2, Rd2, and Re5 may be arranged at the terminals T1~T5, respectively. That is, the reservoirs are formed at the terminals T1~T5, which are connected to the second-layer wiring lines L2 via through holes TH1, and these terminals are constructed so as to include two lattice points, whereby even if a second-layer wiring line L2 overlies one lattice point, it is possible to make a connection with the second-layer wiring line L2 by forming a through hole in the other lattice point. FIG. 8 shows an example of the layout of reservoirs at the second-layer wiring lines L2 in FIG. 6. In this case, according to the first embodiment, reservoirs (surplus portions) Rf1, Rg1, Rh1, Ri1, and Rj1 can be arranged at the second-layer wiring lines L2, respectively. By adopting such a construction as provided in this first embodiment, even if the first-layer wiring lines L1a for passing over cells are present, the reservoirs at the terminals T1~T5 can be formed in the longitudinal direction of the first-layer wiring lines L1a for passing over cells, so that even with the second-layer wiring lines L2 alone, it is possible to make a connection to the terminals T1~T5. Thus, at the time of connecting the terminals with the second-layer wiring lines, which are arranged so as to extend in the vertical direction on the wiring channels Cy1~Cy7, it is possible for each of the terminals to ensure two wiring channels Cy, whereby it is possible to improve the freedom of connection between the terminals T1~T5 and the second-layer wiring lines and to attain a high wiring density and a high integration.

Figure 9:
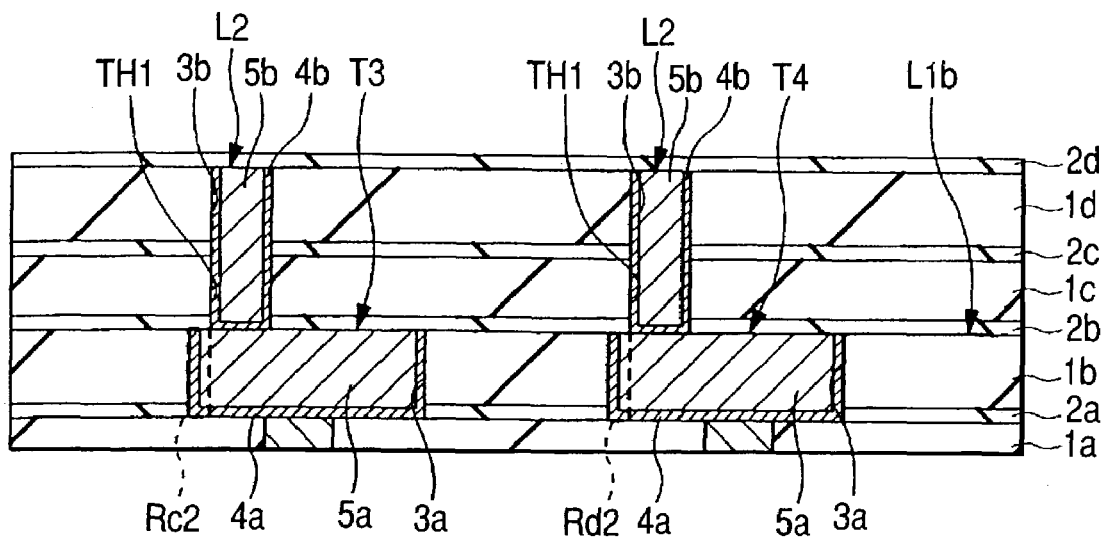
FIG. 9 is a sectional view taken along a wiring channel Cx4 in FIG. 8, showing an example of a wiring structure in a semiconductor device manufactured on the basis of the design data of FIG. 8.
Figure 10:
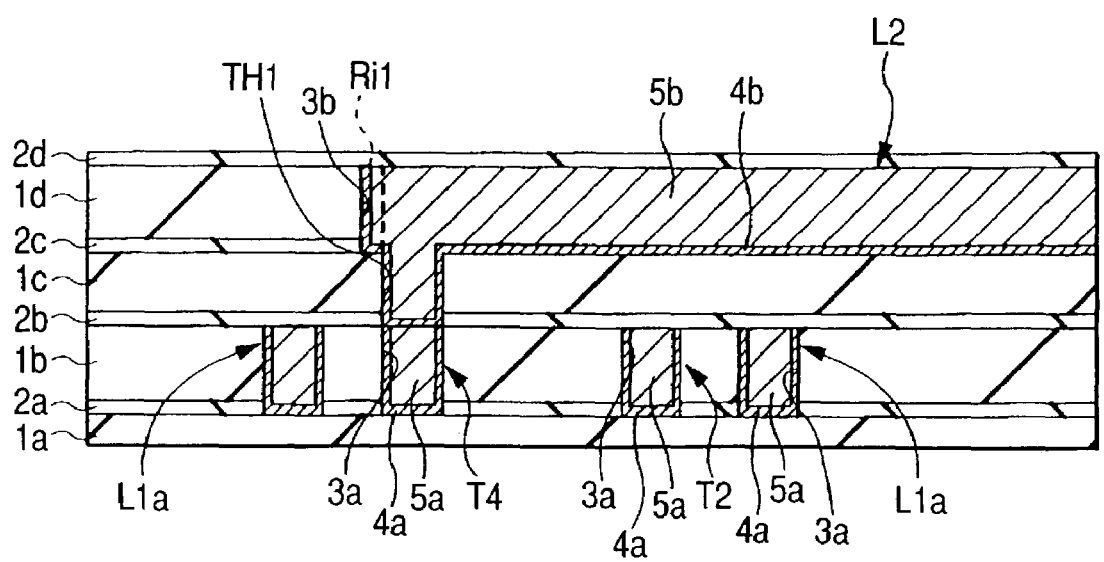
FIG. 10 is a sectional view taken along a wiring channel Cy5 in FIG. 8, showing an example of a wiring structure in the semiconductor device manufactured on the basis of the design data of FIG. 8.

FIG. 9 is a sectional view taken along the wiring channel Cx4 in FIG. 8, showing an example of a wiring structure in a semiconductor device manufactured on the basis of the design data of FIG. 8, and FIG. 10 is a sectional view taken along the wiring channel Cy5 in FIG. 8, showing an example of a wiring structure in the semiconductor device manufactured on the basis of the design data of FIG. 8. These figures show an example in which second-layer wiring lines L2 are formed as buried wiring lines by a dual damascene method. The reference numerals 1c and 1d each denote an insulating film, which is formed of the same material as that of the insulating films 1a and 1b described above. Insulating films 2c and 2d are formed of the same material as that of the insulating films 2a and 2b described above. Wiring grooves (wiring apertures) 3b are formed in the insulating films 1d and 2c, and through holes (wiring apertures) TH1, extending from the bottoms of the wiring grooves 3b and reaching upper surfaces of the terminals T1~T5, are formed in the insulating films 1c and 2b. The second-layer wiring lines L2 are each provided with a conductive barrier film 4b and a main conductor film 5b both buried within the associated wiring groove 3b and through hole TH1. The conductive barrier film 4b is the same as the conductive barrier film 4a described above. Likewise, the main conductor film 5b is the same as the main conductor film 5a described above. Such a buried wiring structure is formed by forming the wiring grooves 3b and the through holes TH1, then depositing the conductive barrier films 4b and the main conductor films 5b so as to fill up the through holes TH1, and polishing extra portions of the conductive barrier films 4b and the main conductor films 5b by the CMP method. Although in FIGS. 9 and 10 reservoirs Rc2, Rd2, and Ri1 are enclosed with broken lines in order to make the drawings easier to see, the reservoirs are formed integrally with terminals and second-layer wiring lines, and there is not an actual boundary (this is also the case with drawings which will be referred to in the following description).

Figure 11:
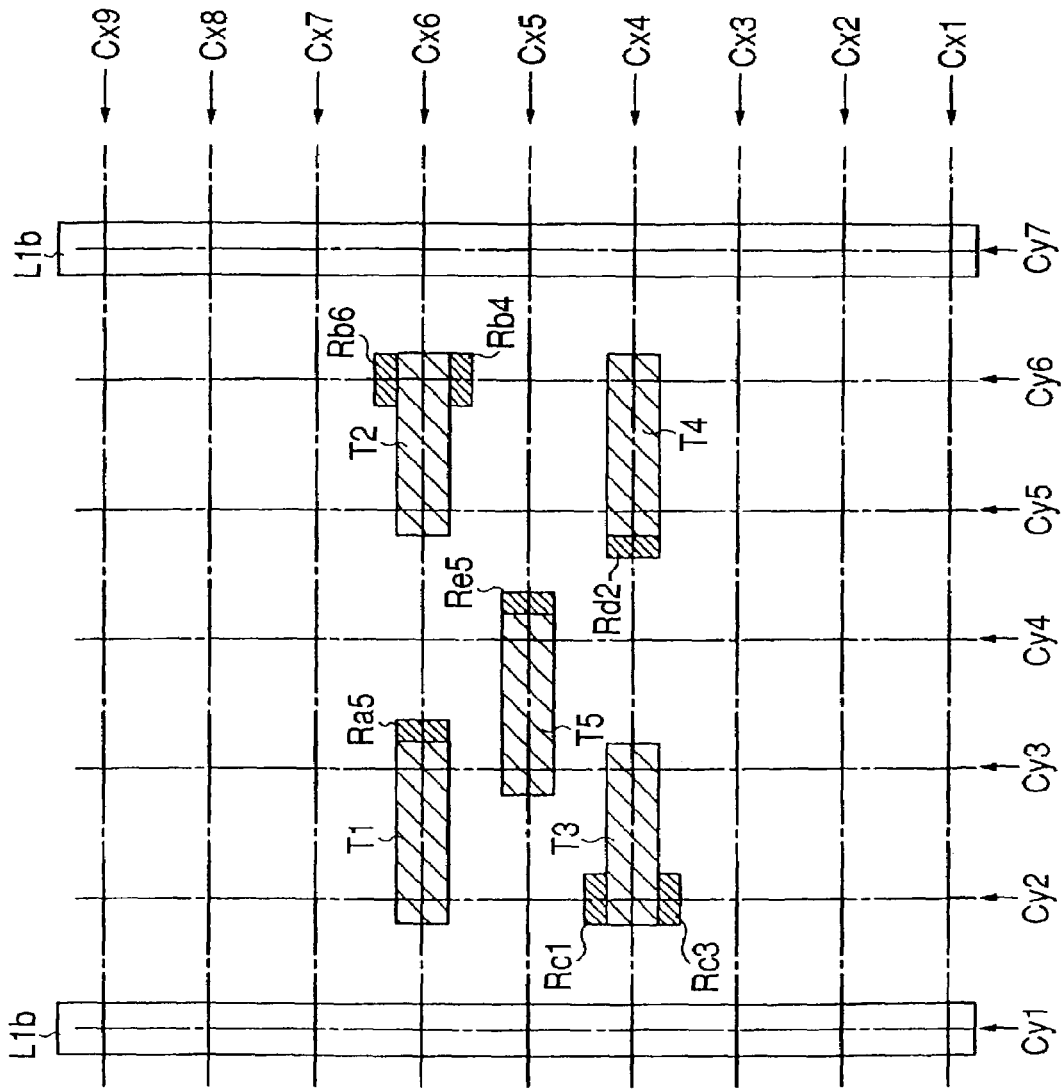
FIG. 11 is a plan view showing a wiring layout in design data with only a first wiring layer illustrated, in which first-layer wiring lines for passing over a cell are arranged along wiring channels Cy1 and Cy7 in the semiconductor device of the embodiment.
Figure 12:
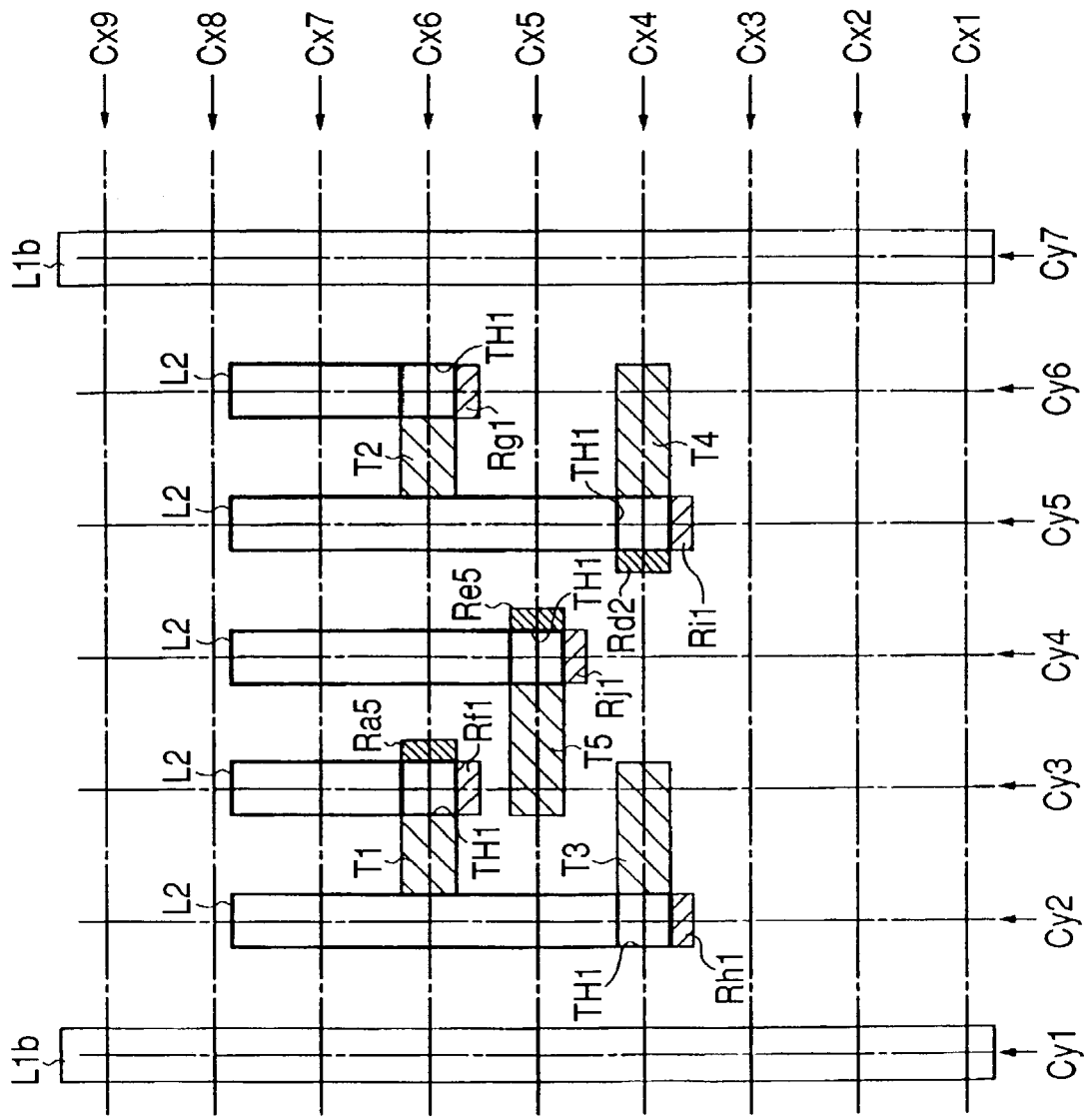
FIG. 12 is a plan view showing a wiring layout with second-layer wiring lines also illustrated in FIG. 11.
Figure 13:
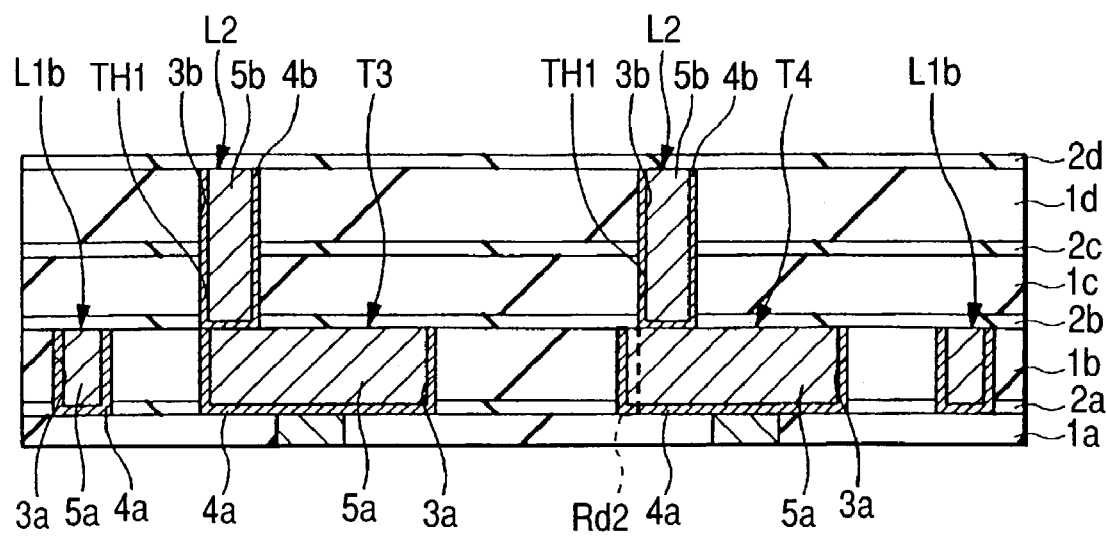
FIG. 13 is a sectional view taken along a wiring channel Cx4 in FIG. 12, showing an example of a wiring structure in a semiconductor device manufactured on the basis of the design data of FIG. 12.
Figure 14:
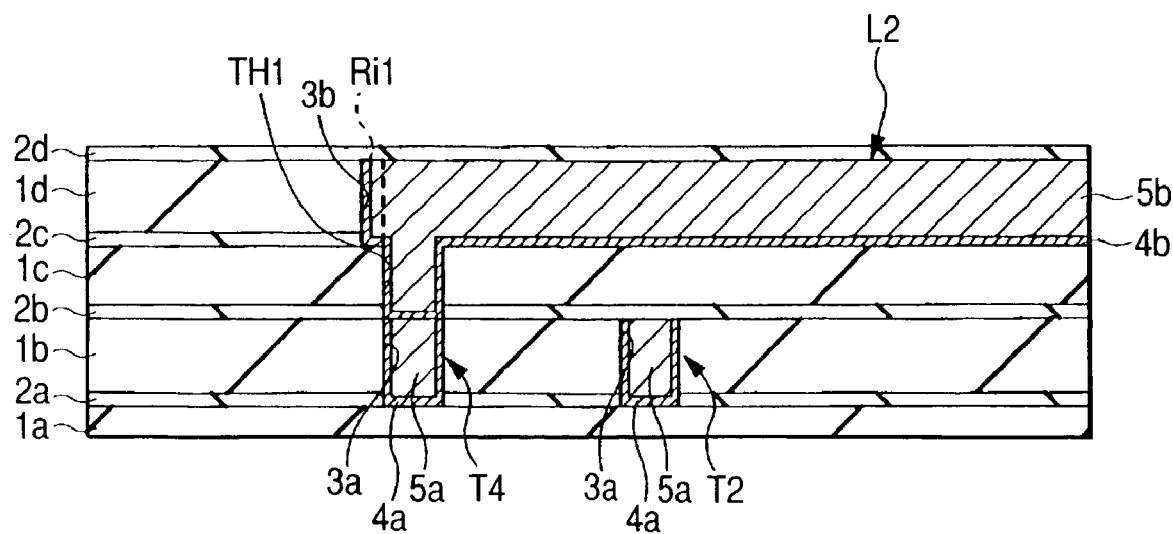
FIG. 14 is a sectional view taken along a wiring channel Cy5 in FIG. 12, showing an example of a wiring structure in the semiconductor device manufactured on the basis of the design data of FIG. 12.

FIG. 11 is a plan view showing a wiring layout in design data, in which only first-layer wiring lines L1b for passing over a cell are arranged along the wiring channels Cy1 and Cy7, and FIG. 12 is a plan view of a principal portion, showing a wiring layout which also includes second-layer wiring lines L2 in addition to the wiring lines shown in FIG. 11. FIG. 13 is a sectional view taken along the wiring channel Cx4 in FIG. 12, showing an example of a wiring structure in a semiconductor device manufactured on the basis of the design data of FIG. 12, and FIG. 14 is a sectional view taken along the wiring channel Cy5, showing an example of a wiring structure in the semiconductor device manufactured on the basis of the design data of FIG. 12. As shown in FIG. 12, the layout of the second-layer wiring lines L2 is the same as in FIGS. 6 to 8 referred to previously. As shown in FIGS. 11 and 13, first-layer wiring lines L1b passing over a cell are arranged along the wiring channels Cy1 and Cy7, which sandwich a group of terminals T1~T5 therebetween. Therefore, at the terminals T2 and T3, it is impossible to generate reservoirs on the wiring channels Cy1 and Cy7 side where the first-layer wiring lines L1b are arranged. To avoid this inconvenience, at the terminals T2 and T3, there are arranged reservoirs Rb6, Rb4, Rc1, and Rc3, which extend in the shorter direction of the terminals T2 and T3. As shown in FIGS. 12 and 14, reservoirs at the second-layer wiring lines L2 are the same as those in FIGS. 8 and 10. In the example shown in FIGS. 7 to 10, the longitudinal direction of the first-layer wiring lines L1a for passing over the cell is in parallel with that of the terminals T1~T5, but by adopting the construction of this first embodiment, even if the first-layer wiring lines L1b are present in the vertical direction perpendicular to the length direction of the terminals T1~T5, it is possible for even only the second-layer wiring lines L2 to connect to the terminals T1~T5 via through holes TH1. The first-layer wiring lines L1b for passing over the cell also have a buried wiring structure. With the reservoirs at the terminals T1~T5 formed in a direction parallel to the first-layer wiring lines L1b for passing over the cell, it is possible for even only the second-layer wiring lines L2 to be connected to the terminals T1~T5 via through holes TH1.

Figure 15:
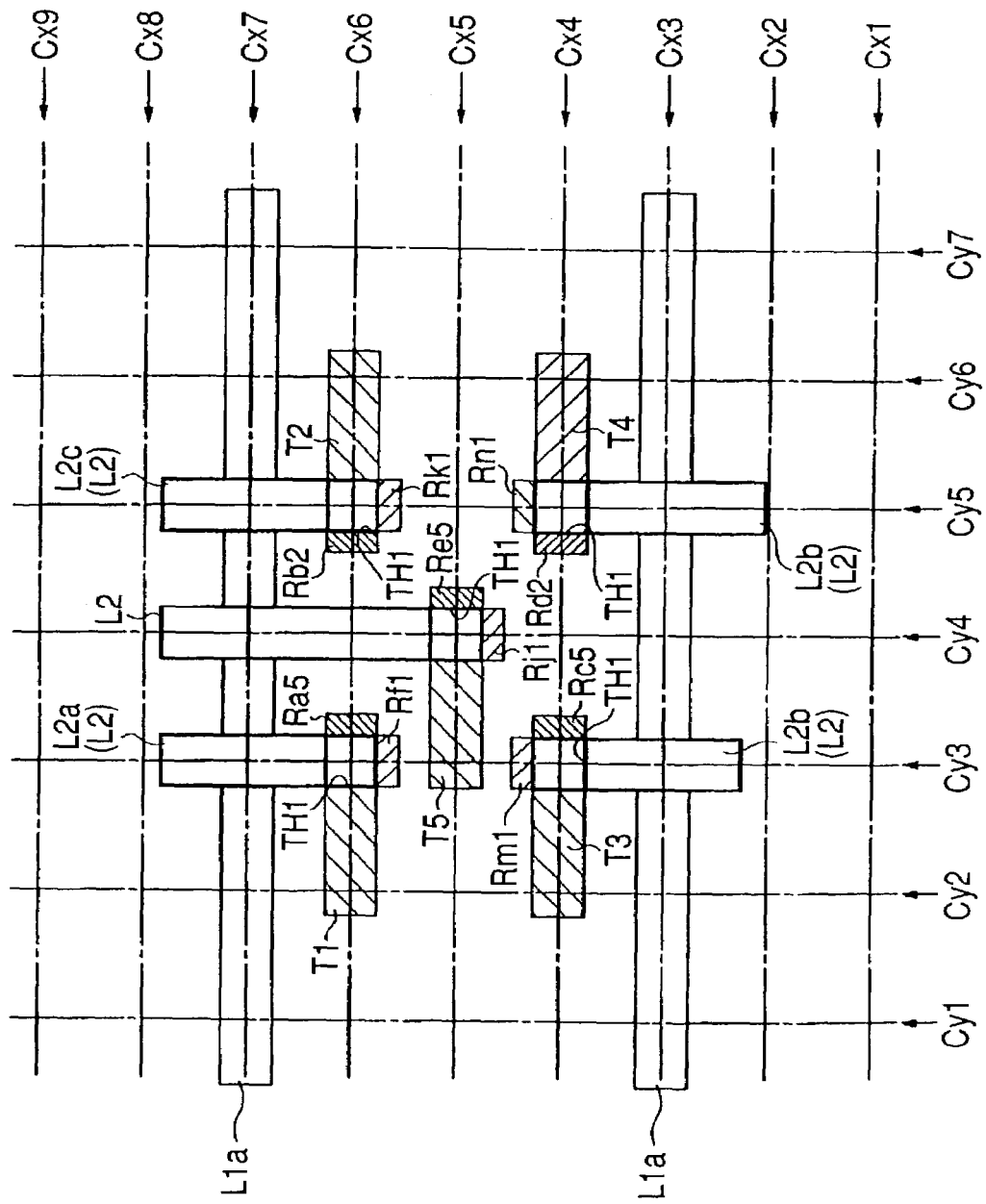
FIG. 15 is a plan view showing a layout of second-layer wiring lines in design data according to a modification of the first embodiment.
Figure 16:
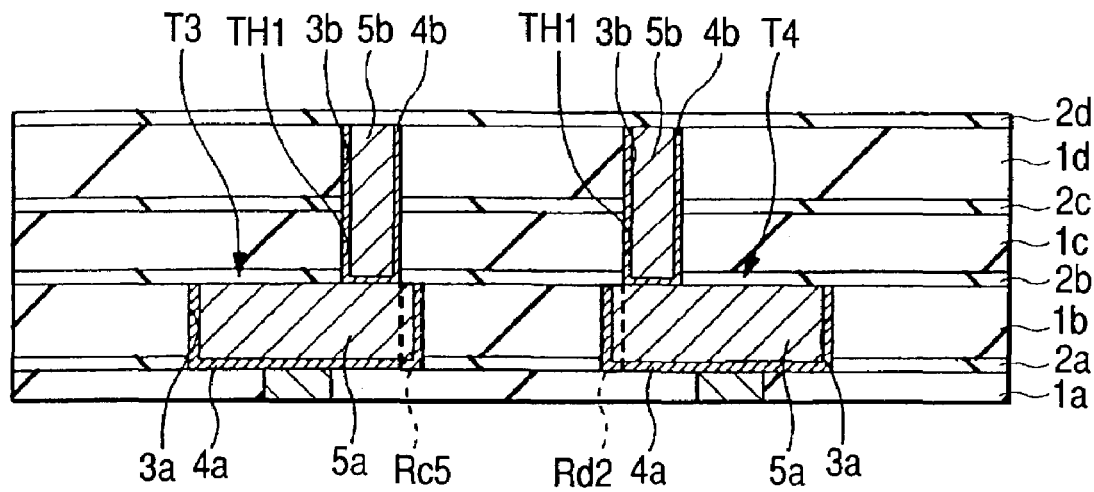
FIG. 16 is a sectional view taken along a wiring channel Cx4 in FIG. 15, showing an example of a wiring structure in a semiconductor device manufactured on the basis of the design data of FIG. 15.
Figure 17:
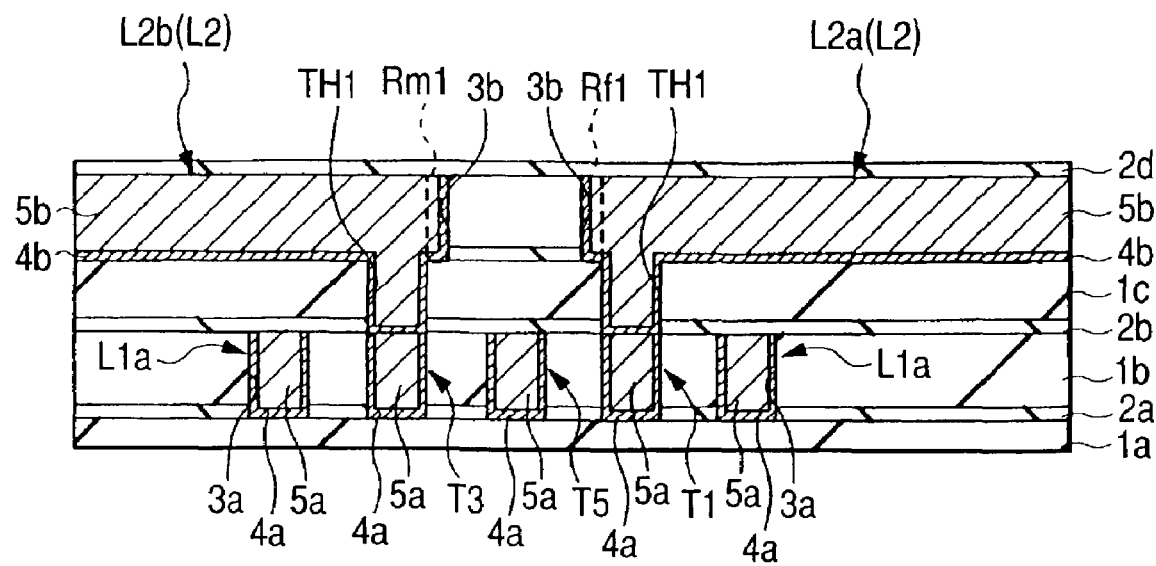
FIG. 17 is a sectional view taken along a wiring channel Cy3 in FIG. 15, showing an example of a wiring structure in the semiconductor device manufactured on the basis of the design data of FIG. 15.

FIG. 15 is a plan view showing a layout of second-layer wiring lines L2 in design data according to a modification of the first embodiment; FIG. 16 is a sectional view taken along the wiring channel Cx4 in FIG. 15, showing an example of a wiring structure in a semiconductor device manufactured on the basis of the design data of FIG. 15; and FIG. 17 is a sectional view taken along the wiring channel Cy3 in FIG. 15, showing an example of a wiring structure in the semiconductor device manufactured on the basis of the design data of FIG. 15. In this modification, the layout of second-layer wiring lines L2 is somewhat different from that shown in FIG. 6. On the wiring channel Cy3, two different second-layer wiring lines L2a and L2b (L2) are provided. The second-layer wiring line L2a extends along the wiring channel Cy3 from above in FIG. 15 and is connected at a lattice point to the terminal T1 via a through hole TH1, while the second-layer wiring line L2b extends along the wiring channel Cy3 from below in FIG. 15 and is connected at a lattice point to the terminal T3 via a through hole TH1. Consequently, at the terminal T3, a reservoir Rc5 is provided in the extending direction of the terminal; while, in the second-layer wiring line L2b, a reservoir Rm1 is provided in the extending direction of the wiring line. Likewise, on the wiring channel Cy5, two different second-layer wiring lines L2c and L2d (L2) are provided. The second-layer wiring line L2c extends along the wiring channel Cy5 from above, as seen in FIG. 15, and is connected at a lattice point to the terminal T2 via a through hole TH1; while, the second-layer wiring line L2d extends along the wiring channel Cy5 from below, as seen in FIG. 15, and is connected at a lattice point to the terminal T4 via a through hole TH1. Consequently, at the terminal T2, there is a reservoir Rb2 in the extending direction of the terminal, while in the second-layer wiring line L2c there is a reservoir (surplus portion) Rk1 in the extending direction of the wiring line. Further, in the second-layer wiring line L2d, a reservoir (surplus portion) Rn1 is generated in the extending direction of the wiring line. Also, in this case, there does not arise any problem related to the layout of reservoirs. Thus, in this first embodiment, by spacing adjacent terminals so as to permit the presence of one or more lattice points therebetween, it is possible to make a connection to the terminals T1~T4 without causing any problem, even in such a layout of second-layer wiring lines L2 as described above. Further, even if the positional relation of the terminals is an opposed relation such as the relation between the terminals T1 and T5, it is possible to make a connection to the terminal T5 without causing any problem, because each terminal includes two lattice points.

Figure 18:
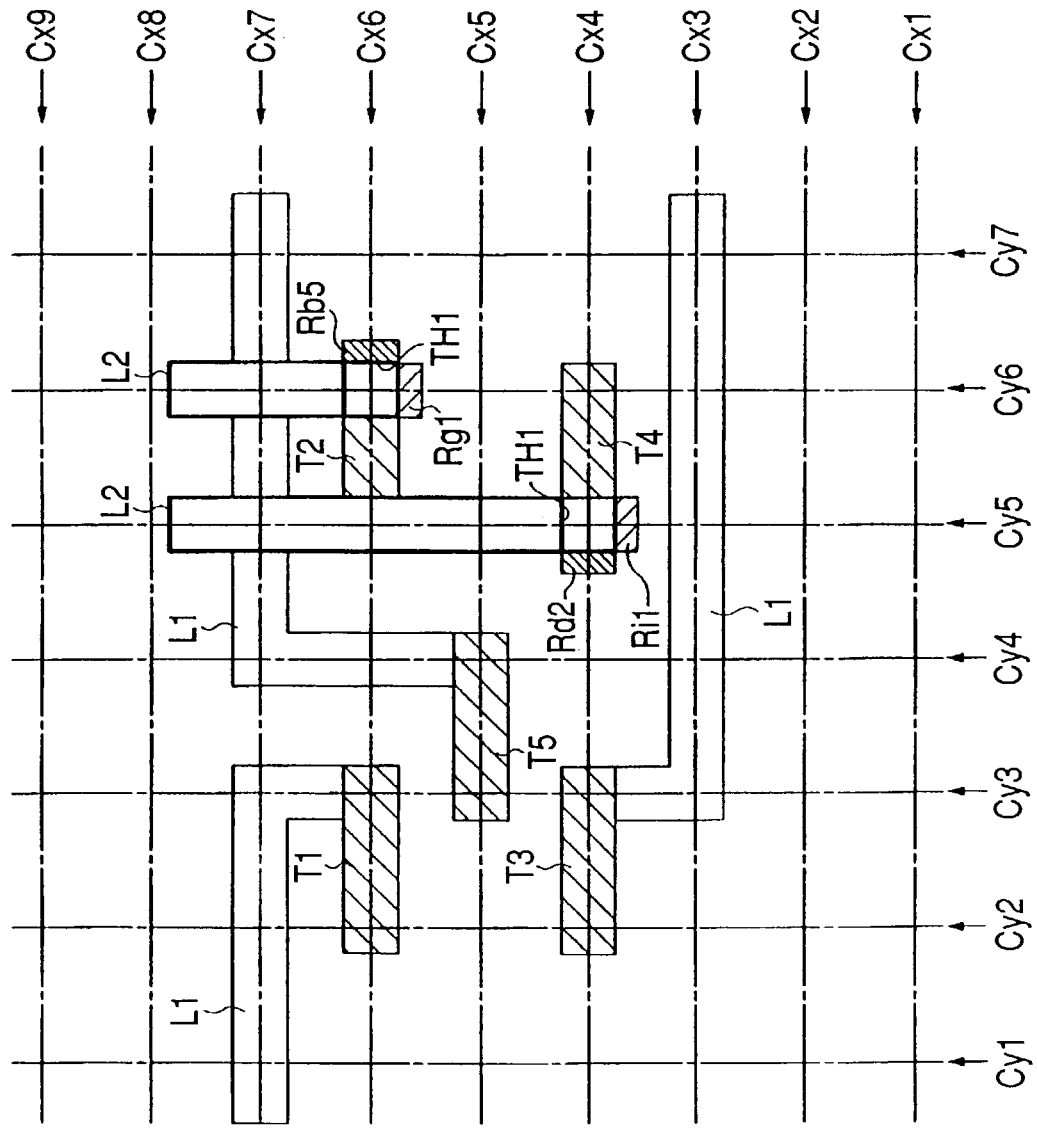
FIG. 18 is a plan view showing a wiring layout in design data with terminals wired by first-layer and second-layer wiring lines.
Figure 19:
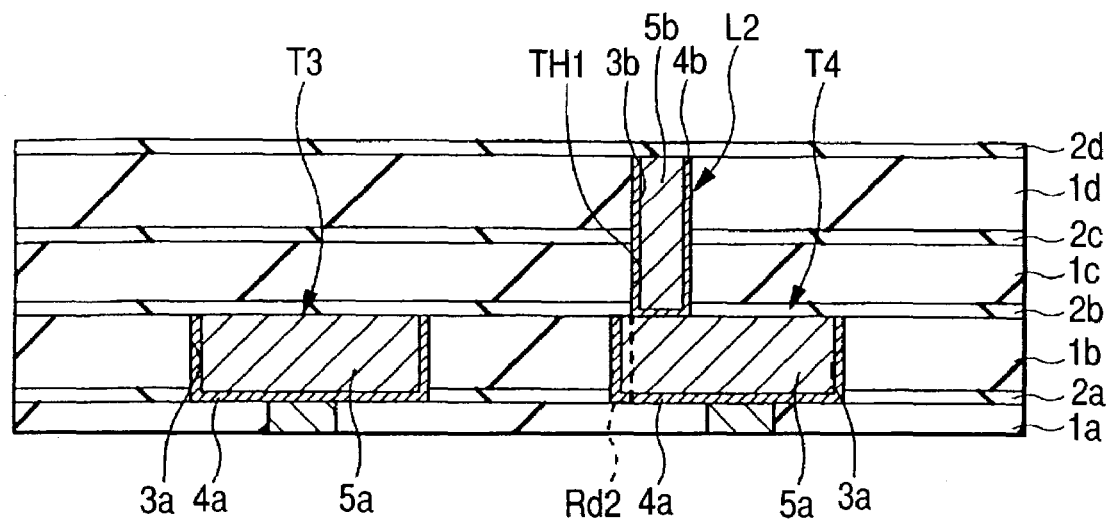
FIG. 19 is a sectional view taken along a wiring channel Cx4 in FIG. 18, showing an example of a wiring structure in a semiconductor device manufactured on the basis of the design data of FIG. 18.

FIG. 18 is a plan view showing a wiring layout in design data with terminals T1~T5 wired using first-layer wiring lines L1 and second-layer wiring lines L2, and FIG. 19 is a sectional view taken along the wiring channel Cx4 in FIG. 18, showing an example of a wiring structure in a semiconductor device manufactured on the basis of the design data of FIG. 18. First-layer wiring lines L1 are the same as those explained previously in connection with FIGS. 3 to 5. Likewise, second-layer wiring lines L2 are the same as those described previously in connection with FIGS. 8 to 10.

A sectional view taken along the wiring channel Cy5 in FIG. 18 is the same as FIG. 10. The layout of reservoirs Rb5 and Rb2 at the terminals T2 and T4 and that of reservoirs (surplus portions) Rg1 and Ri1 at the second-layer wiring lines L2 are the same as those described previously in connection with FIGS. 8 to 10. Thus, according to this first embodiment, it is possible to make a connection to the terminals T1~T5 with use of both first-layer and second-layer wiring lines L1, L2.

Thus, at the time of connecting the terminals T1~T5 to the second-layer wiring lines extending in the vertical direction on the wiring channels Cy1~Cy7, two wiring channels Cy can be ensured for each of the terminals, so that the freedom of connection between the terminals T1~T5 and the second-layer wiring lines can be improved, whereby it is possible to attain a high density of cell-to-cell wiring lines for connection between the terminals of cells which are arranged spacedly in both vertical and transverse directions, and, hence, it is possible to attain a high integration. Moreover, by constituting each of the terminals T1~T5 with use of a pattern of rectangular shape, as seen in plan view, which includes two lattice points Cy in the transverse direction, i.e., in the right and left direction, and by extending the first-layer wiring lines in the transverse direction on the wiring channels Cx1·Cx9, it is possible to improve the freedom of layout of first-layer wiring lines on the wiring channels Cx and to improve the wiring density of cell-to-cell wiring lines for connection between the terminals of cells which are arranged spacedly in both vertical and transverse directions, and, hence, it is possible to attain a high integration. Besides, over-the-cell passing wiring lines, which pass over a cell of concern, can be arranged on vacant wiring channels Cx1, Cx2, Cx8, and Cx9, whereby it is possible to improve the wiring density of cell-to-cell wiring lines for connection between the terminals of cells that are spaced in both vertical and transverse directions, and, hence, it is possible to attain a high integration.

Figure 20:
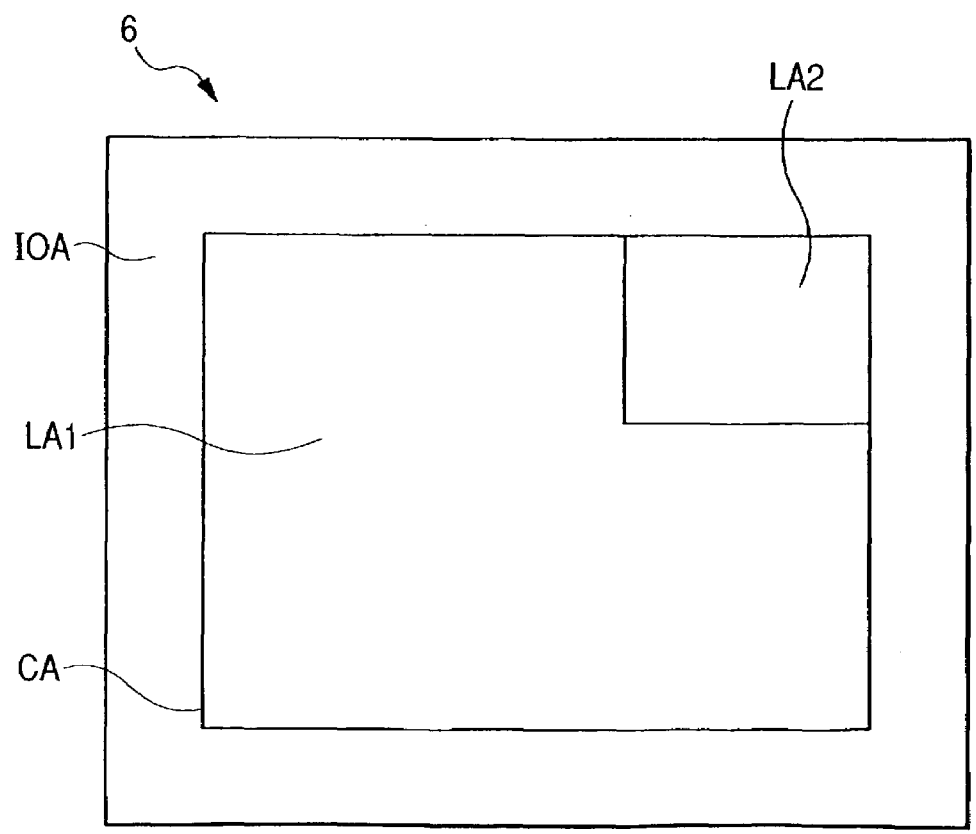
FIG. 20 is a plan view showing the overall semiconductor chip which constitutes the semiconductor device of the embodiment.

Next, a specific example of the semiconductor device of this first embodiment will be described. FIG. 20 is a plan view of the overall semiconductor chip 6, which constitutes the semiconductor device of this first embodiment. The semiconductor chip 6 has a semiconductor substrate (simply "substrate" hereinunder) of a quadrangular shape, as seen in plan view, which is formed of a single crystal silicon (Si), for example. Centrally of a main surface of the semiconductor chip 6, there is disposed an internal circuit area CA having a quadrangular shape. In the internal circuit area CA, there are two logic circuit areas LA1 and LA2 of different types. The foregoing cell terminal structure is applied to the logic circuit areas LA1 and LA2 of the internal circuit area CA. An input/output circuit area IOA is disposed along the outer periphery of the internal circuit area CA. An input circuit and an output circuit, as well as plural external terminals, such as bonding pads and bump electrodes, are formed in the input/output circuit area IOA.

Figure 21:
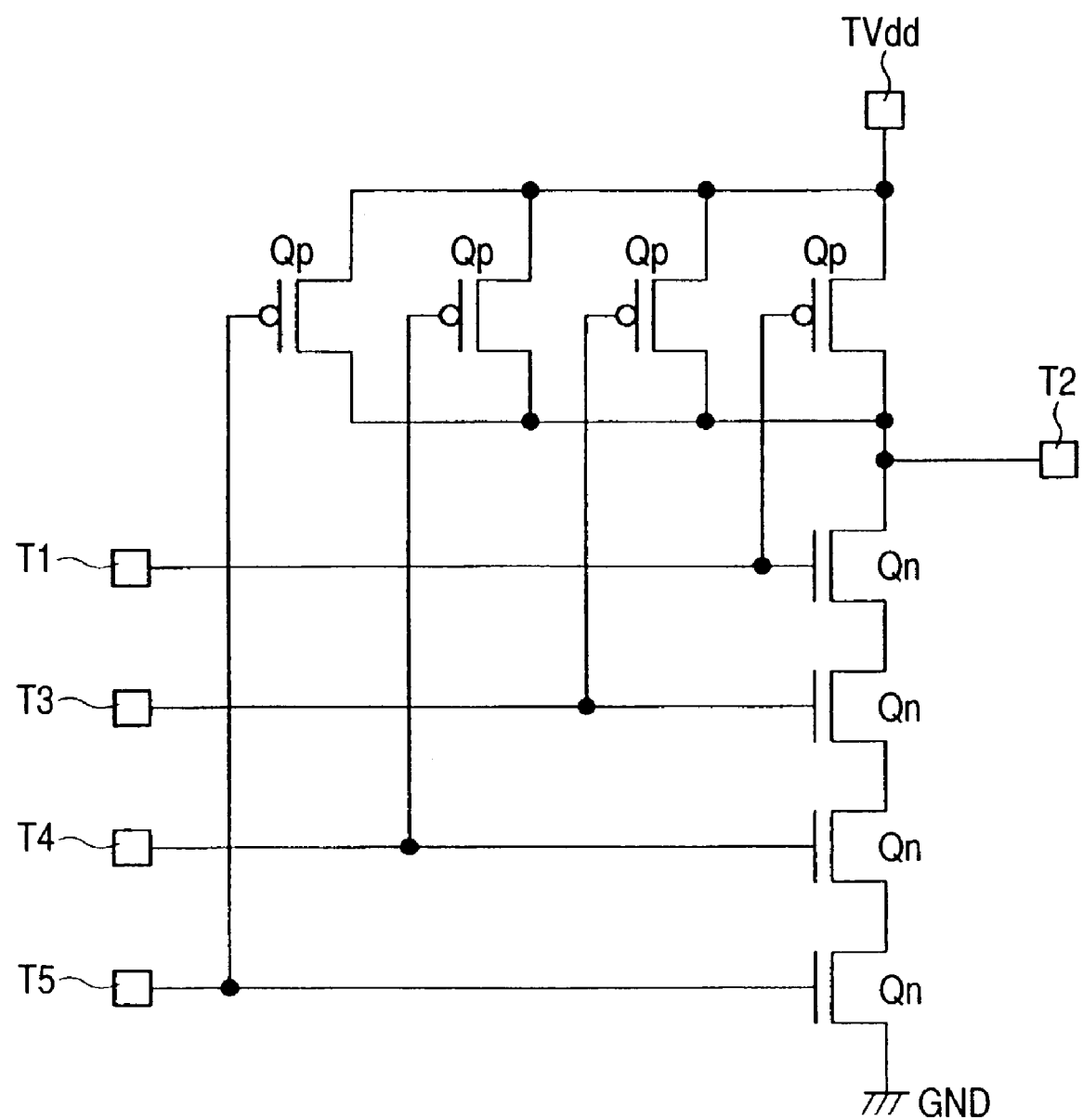
FIG. 21 is a schematic circuit diagram showing an example of a cell formed in the semiconductor chip of FIG. 20.

FIG. 21 shows an example of a circuit diagram of the cell referred to above. In the figure there is shown, for example, a cell (an example of the above standard cell) of a four-input NAND circuit. The NAND circuit has four paralleled pMISQp's and four series-connected nMISQn's. The terminals T1 and T3~T5 are electrically connected to inputs of the NAND circuits, i.e., gate electrodes of the plural pMISQp's and nMISQn's. The terminal T2 is electrically connected to drain regions of the pMISQp's and nMISQn's. The reference symbol TVdd represents a supply voltage terminal on a high potential side, and the mark GND represents a supply potential on a low potential side. Thus, the terminals T1~T5 constitute input/output terminals of the cell.

Although a four-input NAND circuit cell is illustrated as the cell, this constitutes no limitation on the invention, but as examples of the cell, there also are included such logic circuit cells as a NOR type cell, an inverter circuit cell, and a flip-flop circuit cell. Though not shown, plural cells are arranged in both vertical and transverse directions, as noted above, and input/output terminals of those cells are electrically connected using first-layer wiring lines, which extend in the transverse direction on wiring channels Cx, and second-layer wiring lines, which extend in the vertical direction on wiring channels Cy, whereby a desired logic circuit is constituted.

Figure 22:
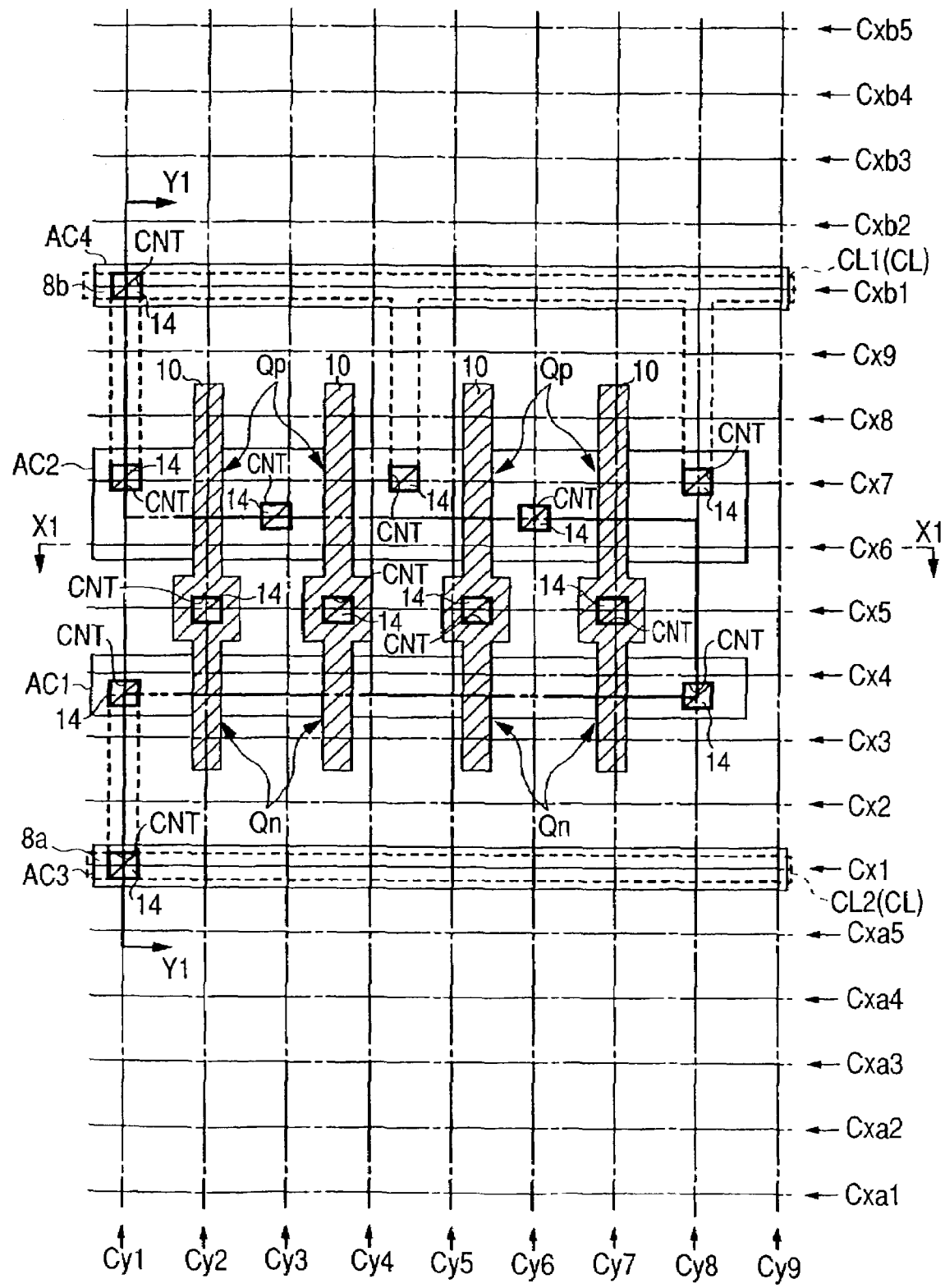
FIG. 22 is a plan view of a gate electrode layer in the semiconductor device shown in FIG. 20.
Figure 23:
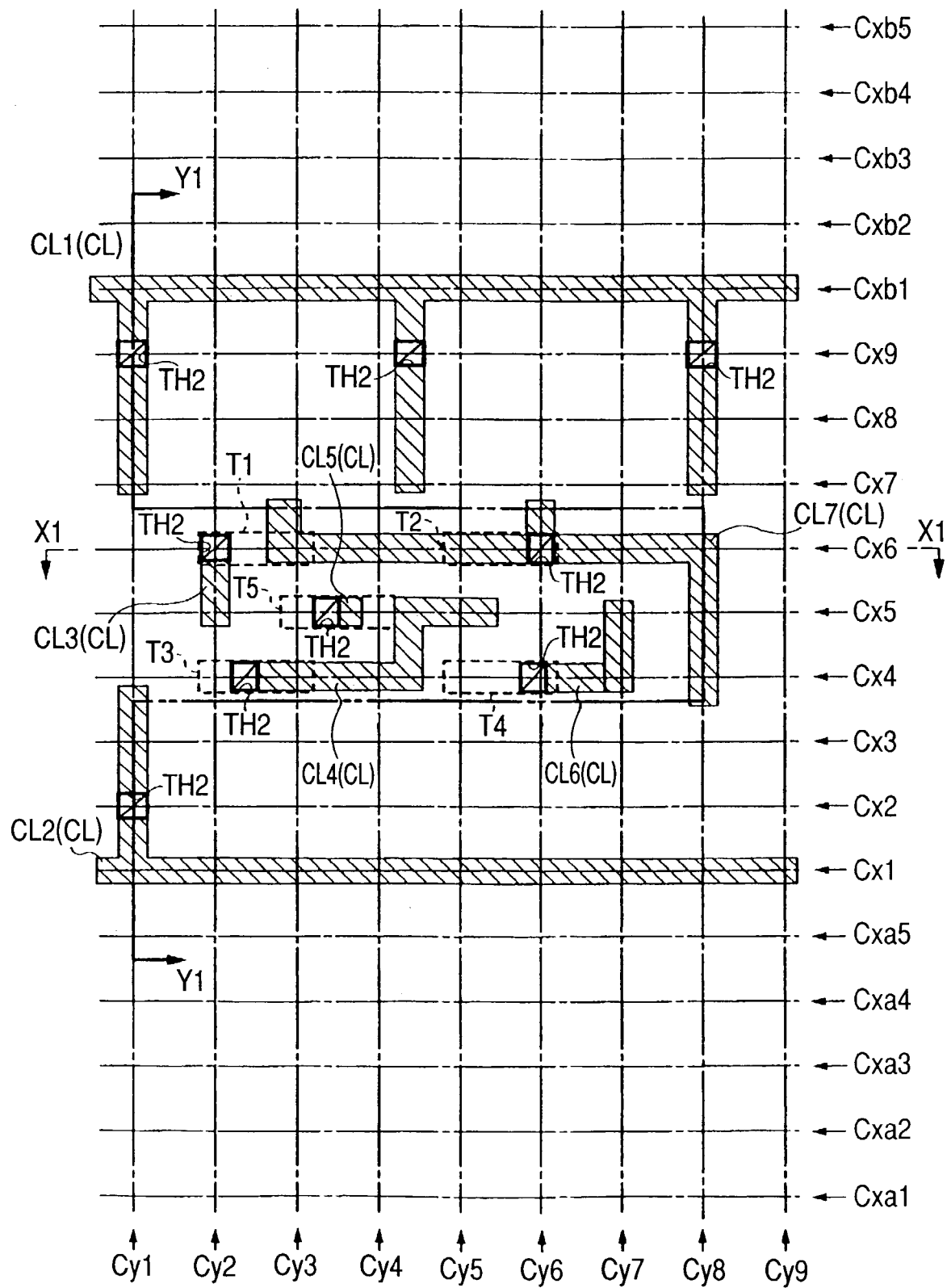
FIG. 23 is a plan view of an intra-cell wiring layer in the semiconductor device shown in FIG. 20.
Figure 24:
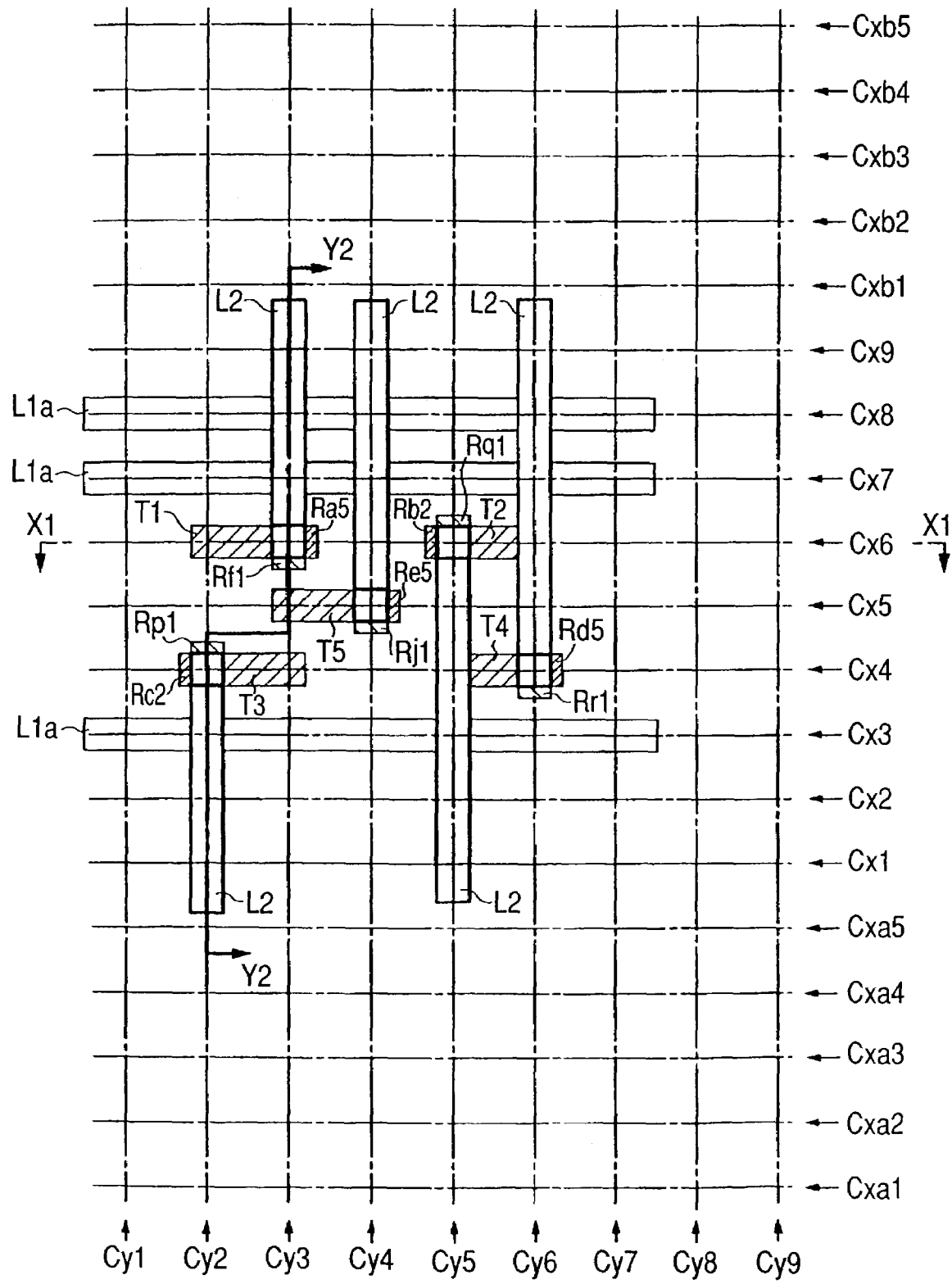
FIG. 24 is a plan view of a terminal layer (a first wiring layer) in the semiconductor device shown in FIG. 20.
Figure 25:
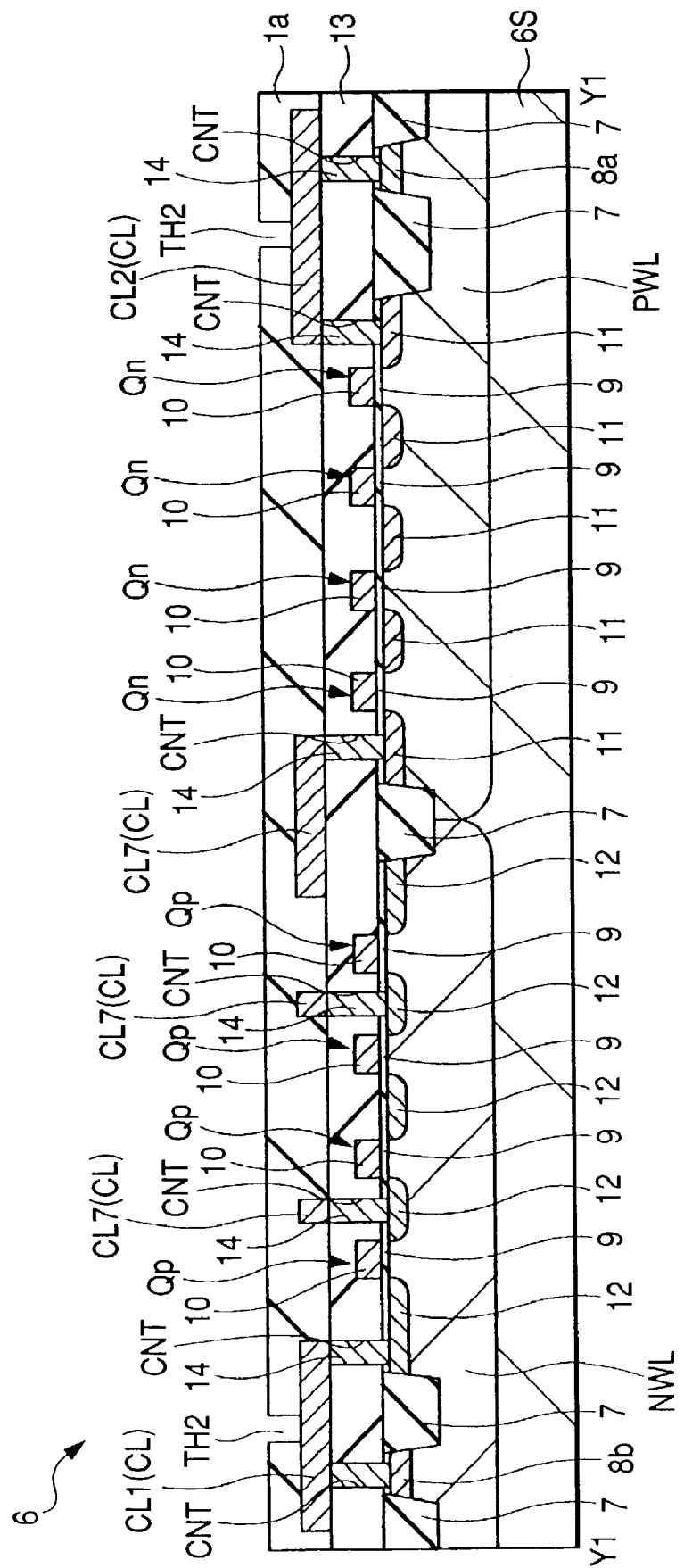
FIG. 25 is a sectional view taken along line Y1—Y1 in FIGS. 22 and 23.
Figure 26:
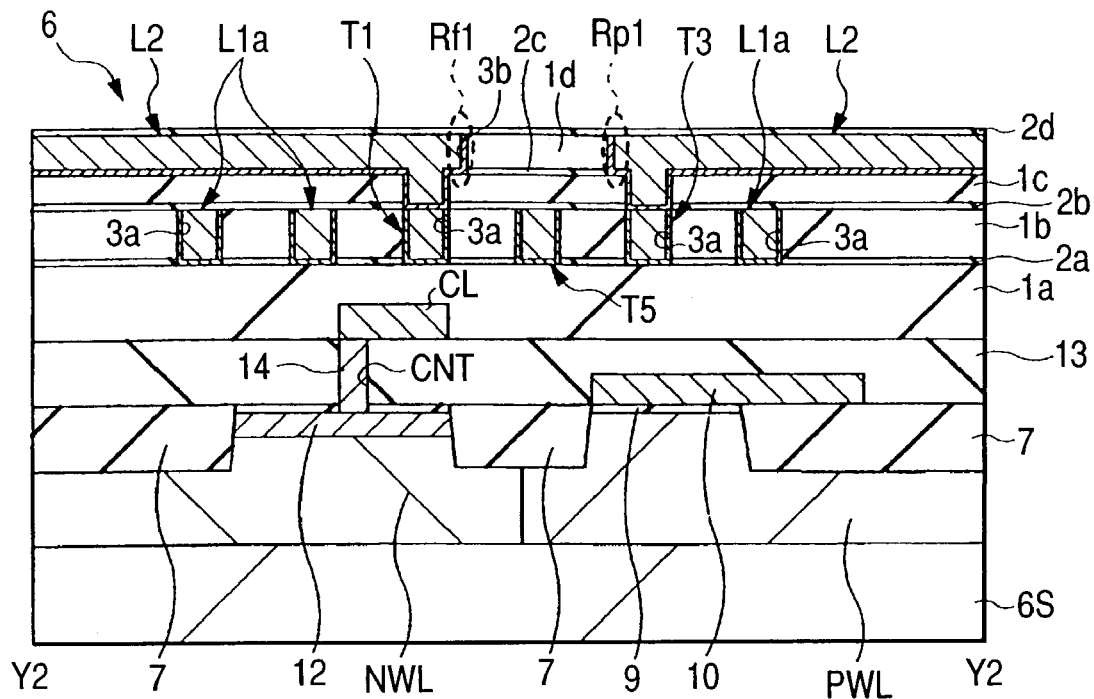
FIG. 26 is a sectional view taken along line Y2—Y2 in FIG. 24.
Figure 27:
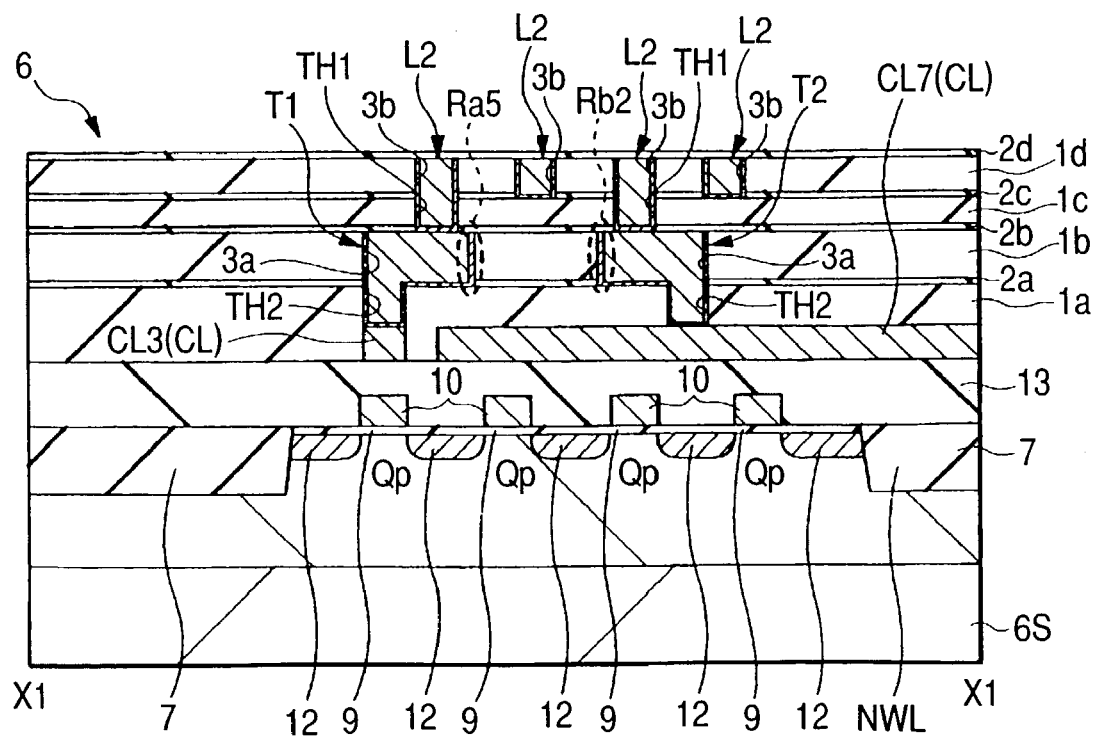
FIG. 27 is a sectional view taken along line X1—X1 in FIGS. 22 to 24.

FIGS. 22 to 24 are plan views at the same position of the semiconductor device, of which FIG. 22 is a plan view of a gate electrode layer, FIG. 23 is a plan view of an intra-cell wiring layer, and FIG. 24 is a plan view of a terminal layer (a first wiring layer). FIG. 25 is a sectional view taken on line Y1—Y1 in FIGS. 22 and 23, FIG. 26 is a sectional view taken on line Y2—Y2 in FIG. 24, and FIG. 27 is a sectional view taken on line X1–X1 in FIGS. 22 to 24. In FIGS. 22 to 24, the reference symbols Cxa1 to Cxa5, Cxb1 to Cxb5, Cy8, and Cy9 represent wiring channels.

As shown in FIGS. 22, 23 and 25, a substrate 6S is formed of a single crystal silicon of p type having a specific resistance of 1 to 10 Ocm, for example. In a main surface (device-forming surface) of the substrate 6S, there are formed shallow groove isolations (SGI) or shallow trench isolations (STI) 7. The shallow groove (trench) isolations 7 are formed by burying, for example, a silicon oxide film into grooves or trenches formed in the main surface of the substrate 6S. Further, a p-type well PWL and an n-type well NWL are formed on the main surface side of the substrate 6S. For example, boron is introduced into the p-type well PWL, while phosphorus is introduced into the n-type well NWL. The plural nMISQn's and pMISQp's are formed respectively in active regions AC1 and AC2 of the p-type well PWL and n-type well NWL, which are surrounded with the isolations 7. As shown in FIG. 22, the active regions AC1 and AC2 are formed using patterns of a rectangular shape, as seen in plan view, which are arranged in parallel with each other, above and below the isolation 7 located centrally. Semiconductor regions 8a and 8b for the supply of electric power to the wells are formed respectively in active regions AC3 and AC4 of the p-type well PWL and the n-type well NWL, which are surrounded with the isolations 7. The semiconductor regions 8a and 8b are formed as p+ type and n+ type, respectively. The active regions AC3 and AC4 (i.e., the semiconductor regions 8a and 8b) are formed using patterns of a band shape as seen in plan view, which extend in the extending direction of wiring channels Cx1 and Cxb1.

A gate insulating film 9 used in the nMISQn's and pMISQp's is, for example, a silicon oxide film having a thickness of about 6 nm. The thickness of the gate insulating film 3, as referred to herein, indicates a film thickness in terms of silicon dioxide and may not be coincident with an actual film thickness. The gate insulating film 9 may be constituted by a silicon oxynitride film, instead of silicon oxide film. That is, a structure may be adopted wherein nitrogen is segregated at an interface between the gate insulating film 9 and the substrate 6S. Gate electrodes 10 of the nMISQn's and pMISQp's are formed on the gate insulating film 9 by laminating, for example, a layer of titanium silicide ($TiSi_x$) or cobalt silicide ($CoSi_x$) on a polycrystalline silicon film of a low resistance. But the gate electrode structure is not limited to this structure, but may be, for example, a so-called polymetal gate structure using a laminate film, consisting of a polycrystalline silicon film of a low resistance, WN (tungsten nitride) film and W (tungsten) film. As shown in FIG. 22, the gate electrodes 10 are formed by patterns of a band shape, as seen in plan view, extending on the isolations 7 and spanning both active regions AC1 and AC2. Thus, the gate electrodes 10 are common to both pMISQp's and nMISQp's. At a longitudinally intermediate portion of each gate electrode 10, there is formed a wider pattern than the other portion. n-Type semiconductor regions 11 for sources and drains of the nMISQn's are formed in the active region AC1 of the p-type well PWL, with phosphorus or arsenic, for example, being introduced therein. On the other hand, p-type semiconductor regions 12 for sources and drains of the pMISQp's are formed in the active region AC2 of the n-type well NWL, with boron, for example, being introduced therein.

An insulating film 13 is deposited on the main surface of the substrate 6S described above. The insulating film 13 is a highly reflowable film, e.g., a BPSG (Boron-doped Phospho Silicate Glass) film, capable of filling up a narrow space where the gate electrodes 10 are present. Alternatively, it may be an SOG (Spin On Glass) film formed by a spin coating method. An upper surface of the insulating film 13 is flattened by CMP, for example. Contact holes CNT are formed in the insulating film 13. The semiconductor regions 11, 12, or part of the upper surfaces of the gate electrodes 10, are exposed from the bottoms of the contact holes CNT. Plugs 14 are formed respectively within the contact holes CNT. For example, the plugs 14 are formed by depositing a film of titanium nitride (TiN) and a tungsten (W) film on the insulating film 13, including the interiors of the contact holes CNT, in such a manner as to fill up the contact holes, then removing the unnecessary titanium nitride film and tungsten film present on the insulating film 13 by a CMP method or an etch-back method, allowing these films to remain within only the interiors of the contact holes CNT. The conductor film buried in the contact holes CNT may be a single metal film, such as a film of copper (Cu) or a copper alloy or a laminate metal film comprising such a single metal film and a metal film such as a film of titanium (Ti), titanium nitride (TiN), tantalum (Ta), or tantalum nitride (TaN) formed at least over or under the single metal film.

On the upper surface of the insulating film 13, intra-cell wiring lines CL1~CL7 (CL) are formed, for example, by patterning a conductor film, such as a tungsten film in accordance with the conventional photolithography technique and dry etching technique. The intra-cell wiring line CL1 is used for the supply of a power voltage and is electrically connected through plugs 14 to the semiconductor region 8b for the well power supply and also to the semiconductor regions 12 of the pMISQp's. The intra-cell wiring line CL2 is used for the supply of a low supply voltage (GND) and is electrically connected through plugs 14 to the semiconductor region 8a for the well power supply and also to the semiconductor regions 11 of the nMISQn's. For example, a titanium silicide ($TiSi_x$) layer or a cobalt silicide ($CoSi_x$) layer may be formed at the connections between the semiconductor regions 8a for the well power supply, as well as the semiconductor regions 11 of nMISQn's, and the plugs 14. The intra-cell wiring lines CL3~CL6 are for input in the pMISQp's and nMISQn's and are electrically connected to the gate electrodes 10 through plugs 14. The intra-cell wiring line CL7 is for output in the pMISp's and nMISQn's and is electrically connected through plugs 14 to the semiconductor regions 12 and 11 of the pMISQp's and nMISQn's. The material of the intra-cell wiring lines CL is not limited to tungsten, but may be any of various other materials. For example, a single metal film, such as a film of aluminum (Al) or aluminum alloy, a single metal film, such as a film of copper (Cu) or copper alloy, or a laminate metal film comprising any of such single metal films and a metal film, such as a film of titanium (Ti), titanium nitride (TiN), tantalum (Ta), or tantalum nitride (TaN), formed at least over or under the single metal film, may be used.

The foregoing buried wiring structure is formed on the intra-cell wiring lines Cl. More specifically, an insulating film 1a, of the same material as that of the insulating film 13, is deposited on the main surface of the substrate 6S, including the intra-cell wiring lines CL1~CL7, and on an upper surface thereof that has been flattened by CMP. As shown in FIGS. 26 and 27, insulating films 2a, 1b, 2b, 1c, 2c, 1d, and 2d are deposited successively on the insulating film 1a. First-layer wiring lines L1a and terminals T1~T5 are formed by the dual damascene method in wiring grooves formed in the insulating films 1b and 2a and also in through holes formed in the insulating film 1a. Likewise, second-layer wiring lines L2 are formed by the dual damascene method in wiring grooves formed in the insulating films 1d and 2c and also in through holes formed in the insulating films 1c and 2b (FIG. 24). In this example, the first-layer wiring lines L1a, the terminals T1~T5 and the second-layer wiring lines L2 are formed by the dual damascene method, but their buried structure is the same as that described above, and, therefore, an explanation thereof will be omitted. The reference symbol TH2 denotes a through hole formed in the insulating film 1a. The terminals T1~T5 are electrically connected to the intra-cell wiring lines CL3, CL7, CL4, CL6, and CL5 via through holes (wiring apertures) TH2. The terminals T1, T3, T4, and T5 are used for input of the cell in the NAND circuit described above and are electrically connected to the gate electrodes 10 of the pMISQp's and nMISQn's through intra-cell wiring lines CL3, CL4, CL6, and CL5 (FIG. 21). The terminal T2 is used for output of the cell in the NAND circuit and is electrically connected through intra-cell wiring lines CL7 to the semiconductor regions 12 and 11 as drain regions of the pMISQp's and nMISQn's. Reservoirs Ra5, Rb2, Rc2, Rd5, and Re5 are disposed at the terminals T1~T5, respectively. Likewise, reservoirs Rf1, Rq1, Rp1, Rr1, and Rj1 are disposed at the second-layer wiring lines L2, respectively. Thus, without any problem, it is possible to make a connection from the second-layer wiring lines L2 to the terminals T1~T5 via the through holes. As the case may be, such constructions as shown in FIGS. 3 and 18 are designed. Thus, according to this first embodiment, while maintaining the connectability (wiring-terminal connectability) to the cell terminals, it is possible to minimize the wasted area of a cell and provide a wiring structure that does not degrade the availability for wiring lines passing over the cell. That is, it becomes possible to maintain the connectability of wiring lines in a semiconductor device having reservoirs without causing a lowering of wiring density due to the arrangement of reservoirs and without causing a great increase of the cell area. Further, it becomes possible to improve the freedom of connection to terminals, improve the wiring density, and attain a high integration.

Second Embodiment

In the first embodiment, a buried wiring structure has been adopted for wiring lines and terminals; while, in this second embodiment, an ordinary structure is adopted, wherein wiring lines and terminals are formed using a photolithography technique and a dry etching technique.

Figure 28:
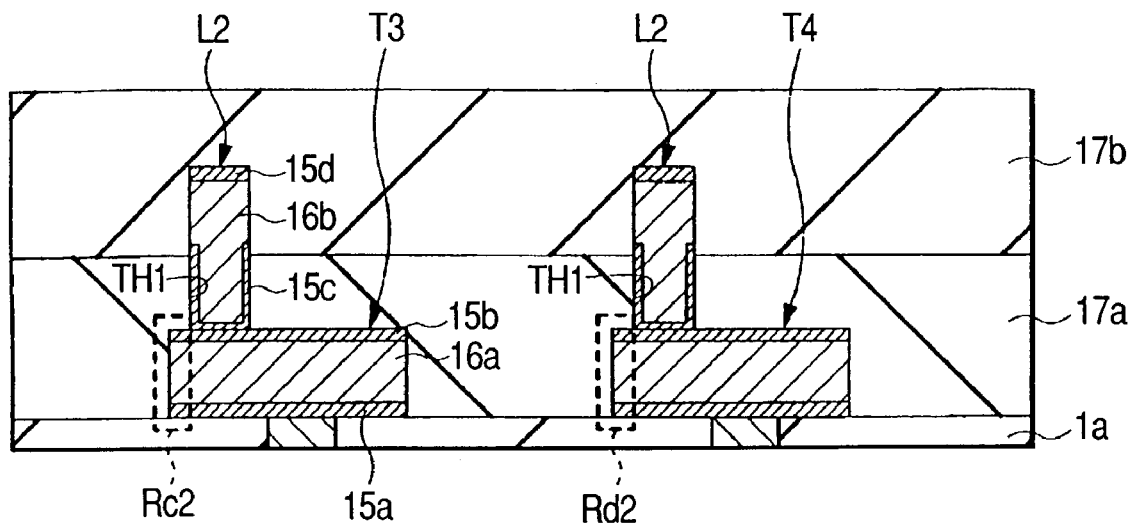
FIG. 28 is a sectional view of a semiconductor device according to another embodiment of the present invention.
Figure 29:
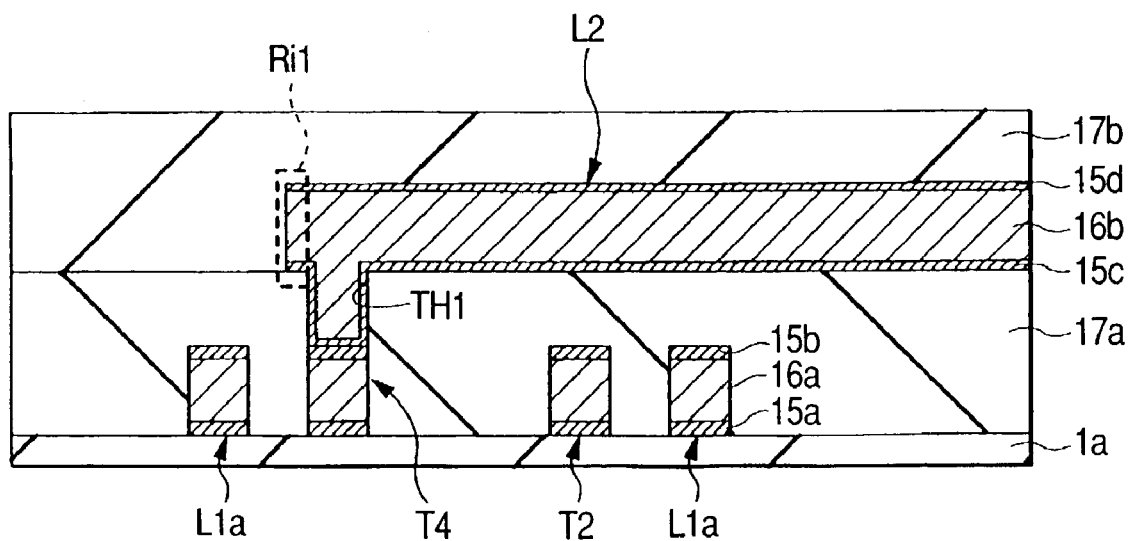
FIG. 29 is a sectional view of another portion of the semiconductor device shown in FIG. 28.
Figure 30:
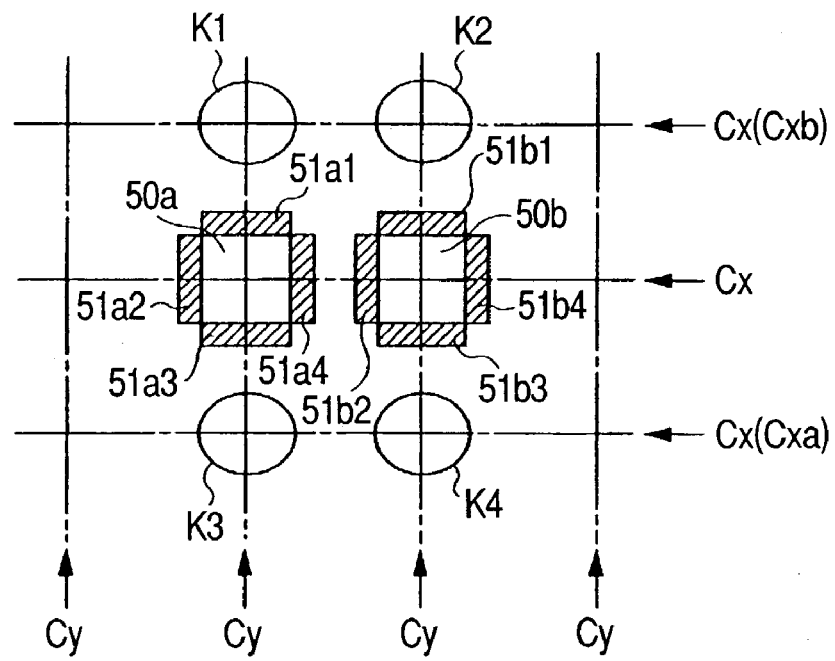
FIG. 30 is a diagram illustrating a problem involved in a reservoir layout technique which the present inventor has studied.
Figure 31:
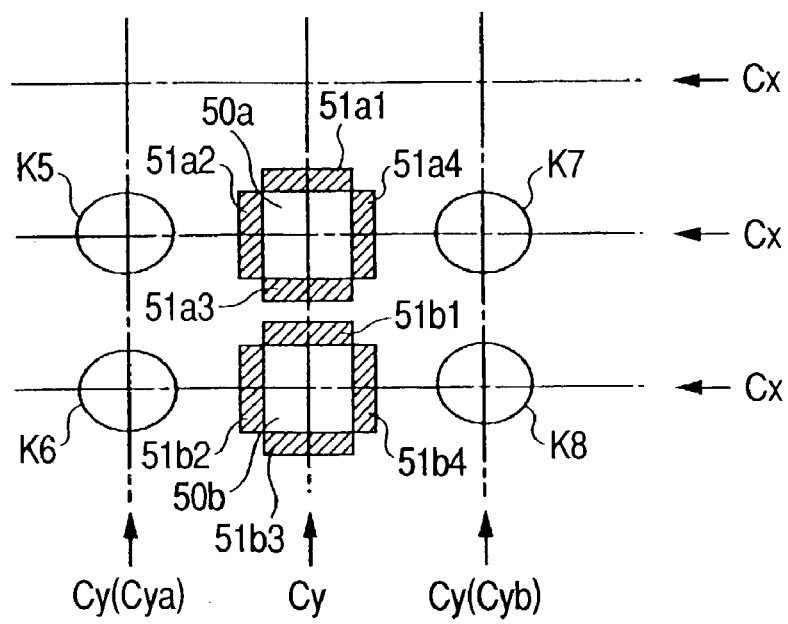
FIG. 31 is a diagram illustrating a problem involved in a reservoir layout technique which the present inventor has studied.
Figure 32:
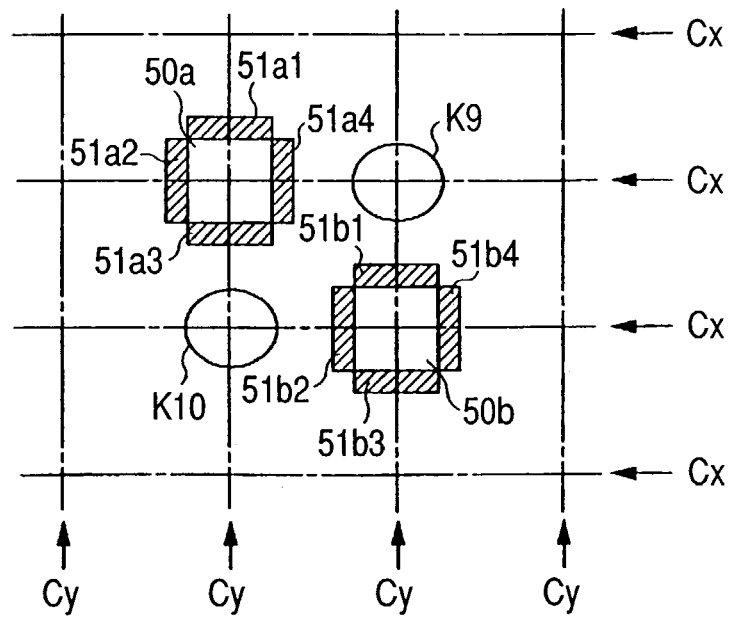
FIG. 32 is a diagram illustrating a problem involved in a reservoir layout technique which the present inventor has studied.
Figure 33:
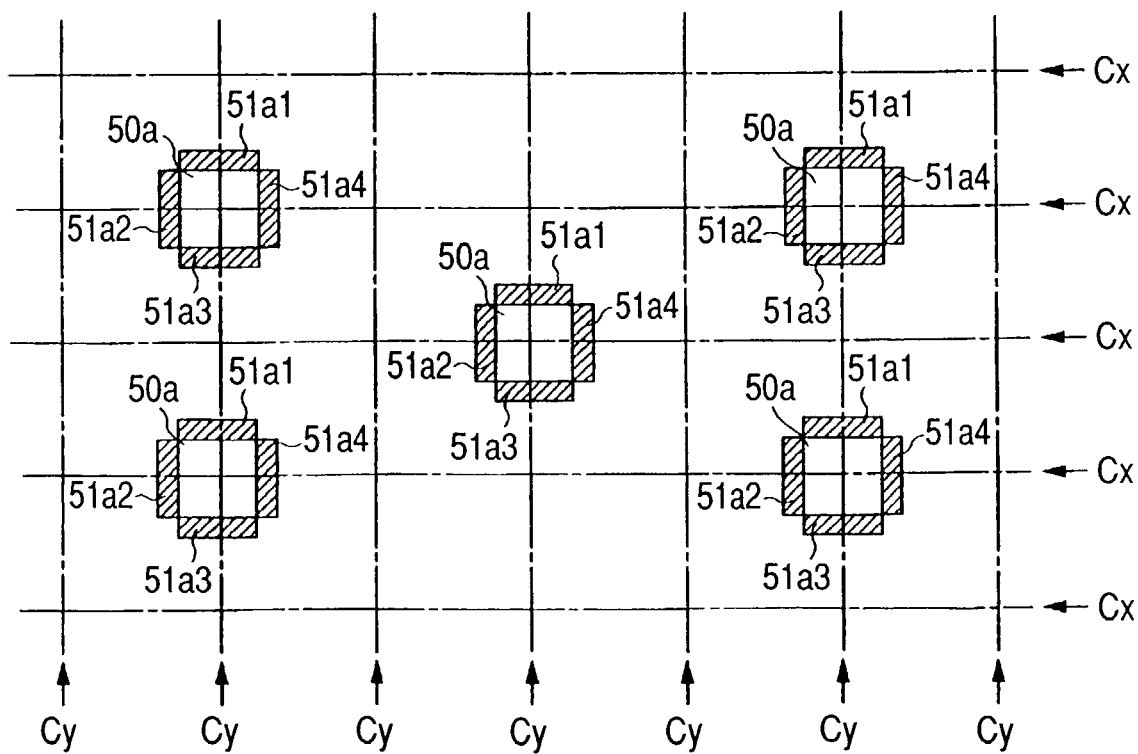
FIG. 33 is a diagram illustrating a problem involved in a reservoir layout technique which the present inventor has studied.
Figure 34:
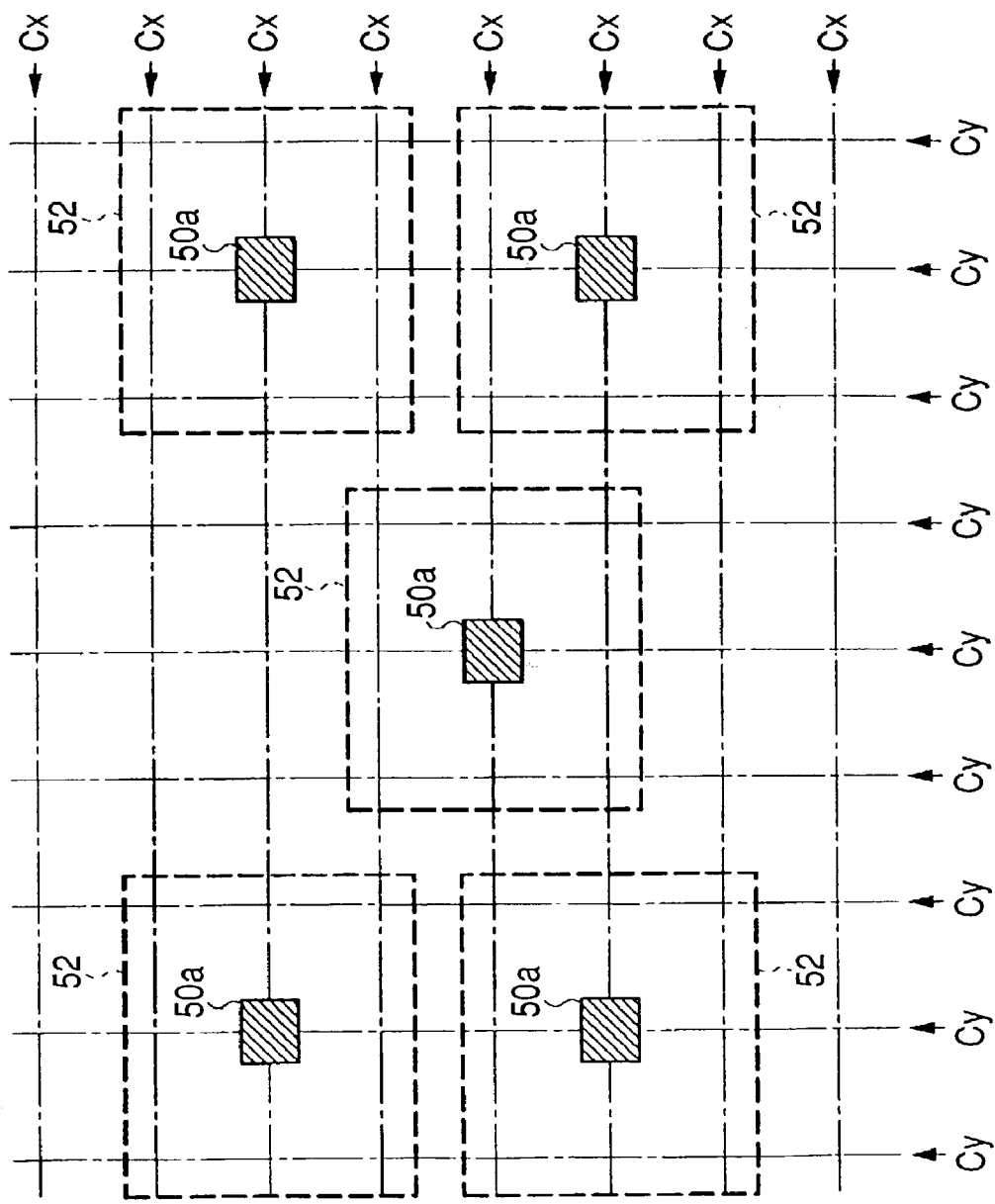
FIG. 34 is a diagram illustrating a terminal layout technique which the present inventor has studied.

FIGS. 28 and 29 are sectional views of wiring layers illustrated in terms of a wiring structure adopted in this second embodiment with respect to the same portions as shown in FIGS. 9 and 10 in connection with the first embodiment. Terminals T1~T5 (see FIG. 8) and first-layer wiring lines L1a, which serve as over-the-cell passing wiring lines, have conductor films 15a, 16a, and 15b, as shown in FIGS. 28 and 29. Upper and lower conductor films 15a and 15b, which are relatively thin, are formed, for example, by depositing titanium nitride on titanium nitride or titanium (Ti). An intermediate conductor film 16a, which is relatively thick, is formed of aluminum (Al) or aluminum alloy (e.g., Al—Si—Cu alloy), for example. The terminals T1~T5 and first-layer wiring lines L1a used in this second embodiment are formed by depositing the conductor films 15a, 16a, and 15b successively from below and, thereafter, patterning them by a photolithography technique or a dry etching technique. The terminals T1~T5 and the first-layer wiring lines L1a are covered with an insulating film 17a, which is deposited on the insulating film 1a. The insulating film 17a is formed of silicon oxide, for example, and through holes TH1 are formed in part of the insulating film 17a. Second-layer wiring lines L2 are formed on the insulating film 17a and are electrically connected to the terminals T3 and T4 via through holes TH1. The wiring structure of the second-layer wiring lines L2 is the same as that of the terminals T1~T5 and has conductor films 15c, 16b, and 15d. The conductor films 15c and 15d, which are relatively thin, are the same as the conductor films 15a and 15b. The conductor film 16d, which is a relatively thick intermediate film, is the same as the conductor film 16a. The method used to form the second-layer wiring lines L2 is also the same as that used for the terminals T1~T5. The second-layer wiring lines L2 are covered with an insulating film 17b, which is formed of silicon oxide on the insulating film 17a. Also, in this second embodiment, the second-layer wiring lines L2 can be connected to the terminals T1~T5 via the through holes TH1 without giving rise to any problem in connection with the layout of the reservoirs Rc2, Rd2, and Ri1. Since aluminum, which is a main wiring material used in this second embodiment, is easy to induce electromigration in comparison with copper, which is a main wiring material used in the first embodiment, the arrangement of the reservoirs is effective in improving the reliability of the wiring.

Although the present invention has been described above specifically by way of exemplary embodiments thereof, it goes without saying that the invention is not limited to the above-described embodiments, but that various changes may be made within a scope not departing from the gist of the invention.

Although the present invention has been described above mainly with reference to a case where it is applied to a semiconductor device having a NAND circuit as a background application field, this constitutes no limitation on the invention. For example, the present invention is also applicable to a mixed type semiconductor device in which a memory circuit, such as, for example, a DRAM (Dynamic Random Access Memory), SRAM (Static Random Access Memory), or a flash memory (EEPROM: Electric Erasable Programmable Read Only Memory), and a logic circuit are provided on one and same semiconductor substrate.

The following is a brief description of effects obtained by typical modes of the present invention as disclosed herein.

By forming each terminal to have a shape so as to cover two or more lattice points, it is possible to improve the freedom of connection to the terminal, and it is also possible to improve the wiring density of cell-to-cell wiring lines.

By forming each terminal to have a shape so as to cover two or more lattice points and by arranging plural terminals in such a manner that one or more vacant lattice points are interposed between terminals which are adjacent to each other in their length direction, it becomes possible to maintain the connectability of wiring lines in a semiconductor device having reservoirs without causing a great increase of the cell area.

The following is a brief description of effects obtained by typical features of the present invention as disclosed herein.

It is possible to improve the freedom of connection to a terminal.

It is also possible to improve the wiring density.

Moreover, it is possible to maintain the connectability of wiring lines in a semiconductor device having reservoirs.

What is claimed is:

1. A method of manufacturing a semiconductor device, comprising the steps of:
   (a) forming an N-type transistor and a P-type transistor in an intra cell region, so as to comprise a function cell;
   (b) forming an intra cell wiring layer connecting said N-type transistor and P-type transistor in an intra cell region;
   (c) forming a terminal pattern in a first wiring layer along a first direction, said terminal pattern being connected by a via to said intra cell wiring layer; and
   (d) forming a wiring line in a second wiring layer different from the first wiring layer along a second direction, the wiring line being connected to the terminal pattern through a hole,
      wherein said terminal pattern shares two or more lattice points on the first wiring layer, and further comprising:

(e) forming a surplus portion at the terminal pattern in a position where the hole is formed on the same wiring layer as the terminal pattern, and wherein the surplus portion is provided so as to extend in a shorter direction of the terminal pattern or in a longer direction of the terminal pattern by a length not larger than one lattice point from a plane center of said hole.

2. A method according to claim 1, wherein the terminal pattern has a rectangular shape.

3. A method according to claim 1, wherein a plurality of terminal patterns are formed, at least one thereof being said terminal pattern sharing two or more lattice points on the first wiring layer; and wherein the plurality of terminal patterns are arranged such that one or more lattice points are interposed between adjacent said terminal patterns.

4. A method according to claim 1, wherein the first direction and the second direction are different from each other.

5. A method according to claim 4, wherein the first direction and the second direction are perpendicular to each other.

6. A method according to claim 1, wherein when another wiring line or another terminal pattern is present at a position adjacent longitudinally to the terminal pattern in a same layer as the terminal pattern, the surplus portion is provided so as to extend in the shorter direction of the terminal pattern, with a length not larger than one lattice point from a plane center of the hole.

* * * * *